(12) United States Patent
Ong et al.

(10) Patent No.: US 9,607,681 B2
(45) Date of Patent: Mar. 28, 2017

(54) MEMORY DEVICE THAT SUPPORTS MULTIPLE MEMORY CONFIGURATIONS

(71) Applicant: eveRAM Technology America, Inc., Pleasanton, CA (US)

(72) Inventors: Adrian E. Ong, Pleasanton, CA (US); Byeong Cheol Na, Tracy, CA (US); Tim Lao, Sacramento, CA (US)

(73) Assignee: EVERAM TECHNOLOGY INC., Hsinchu (TW)

( * ) Notice: Subject to any disclaimer, the term of this patent is extended or adjusted under 35 U.S.C. 154(b) by 0 days.

(21) Appl. No.: 14/835,986

(22) Filed: Aug. 26, 2015

(65) Prior Publication Data

US 2017/0062039 A1    Mar. 2, 2017

(51) Int. Cl.
| | | |
|---|---|---|
| G11C 17/00 | (2006.01) |
| G11C 11/4074 | (2006.01) |
| G11C 29/50 | (2006.01) |
| G11C 11/4091 | (2006.01) |
| G11C 17/16 | (2006.01) |
| G11C 17/18 | (2006.01) |
| G11C 11/4093 | (2006.01) |

(52) U.S. Cl.
CPC ...... *G11C 11/4074* (2013.01); *G11C 11/4091* (2013.01); *G11C 11/4093* (2013.01); *G11C 17/16* (2013.01); *G11C 17/18* (2013.01); *G11C 29/50* (2013.01); *G11C 2029/5006* (2013.01)

(58) Field of Classification Search
CPC ..... G11C 7/1066; G11C 7/1072; G11C 17/16; G11C 17/18; G11C 17/14; G11C 17/143; G11C 11/401
USPC .............................................. 365/96, 233.13
See application file for complete search history.

(56) References Cited

U.S. PATENT DOCUMENTS

2002/0093082 A1 * 7/2002 Miyamoto ............. H01L 22/22
257/678

* cited by examiner

*Primary Examiner* — Huan Hoang
(74) *Attorney, Agent, or Firm* — Venture Pacific Law, PC

(57) ABSTRACT

A memory device comprises: a plurality of memory configuration modes; an option selection logic for selecting one of the plurality of memory configuration modes to operate the memory device; and bonding pads. The bonding pads are connected to inputs of the option selection logic. The bonding pads are configurable to allow for a default mode selection for the selected one of the plurality of memory configuration modes to operate the memory device.

19 Claims, 30 Drawing Sheets

| Bonding Option | | | Memory Configuration | Override Bonding Option |
|---|---|---|---|---|
| XOPTR | XOPTP2 | XOPT16 | | |
| Vss | Vss | - | LPDDR3 | No override |
| Vss | XVdd2 | - | LPDDR2 | MR155 (TMR27); Op[6,5,4] = xx1 |
| XVdd2 | Vss | - | R+LPDDR3 | MR155 (TMR27); Op[6,5,4] = x1x |
| - | - | Vss | X32 I/O | No override |
| - | - | XVdd2 | X16 I/O | MR155 (TMR27); Op[6,5,4] = 1xx |

Fig. 3a

| BP_OPTP2 | BP_OPTP3 | TM_OPTP2 | TM_OPTP3 | OPTP2 | OPTP3 | Description |
|---|---|---|---|---|---|---|
| 0 | 0 | 0 | 0 | 0 | 0 | Bond option LPDDR4 mode |
| 0 | 0 | 0 | 1 | 0 | 1 | Override Bond option, force LPDDR3 mode |
| 0 | 0 | 1 | 0 | 1 | 0 | Override Bond option, force LPDDR2 mode |
| 0 | 0 | 1 | 1 | 0 | 0 | Override Bond option, force LPDDR4 mode |
| 0 | 1 | 0 | 0 | 0 | 1 | Bond option LPDDR3 mode |
| 0 | 1 | 0 | 1 | 0 | 1 | Override Bond option, force LPDDR3 mode |
| 0 | 1 | 1 | 0 | 1 | 0 | Override Bond option, force LPDDR2 mode |
| 0 | 1 | 1 | 1 | 0 | 0 | Override Bond option, force LPDDR4 mode |
| 1 | 0 | 0 | 0 | 1 | 0 | Bond option LPDDR2 mode |
| 1 | 0 | 0 | 1 | 0 | 1 | Override Bond option, force LPDDR3 mode |
| 1 | 0 | 1 | 0 | 1 | 0 | Override Bond option, force LPDDR2 mode |
| 1 | 0 | 1 | 1 | 0 | 0 | Override Bond option, force LPDDR4 mode |
| 1 | 1 | 0 | 0 | 0 | 1 | Invalid bond option, force LPDDR4 mode |
| 1 | 1 | 0 | 1 | 0 | 1 | Override Bond option, force LPDDR3 mode |
| 1 | 1 | 1 | 0 | 1 | 0 | Override Bond option, force LPDDR2 mode |
| 1 | 1 | 1 | 1 | 0 | 0 | Override Bond option, force LPDDR4 mode |

Fig. 4a

| BP_OPTR | TM_OPTR | OPTR | Description |
|---|---|---|---|
| 0 | 0 | 0 | Bond option: HSUL mode |
| 0 | 1 | 1 | Override bond option force R+ Mode (LVSTL) |
| 1 | 0 | 1 | Bond option R+ mode (LVSTL) |
| 1 | 1 | 1 | Keep bond option as R+ mode |

Fig. 4b

| BP_OPT16 | TM_OPT16 | OPT16 | Description |
|---|---|---|---|
| 0 | 0 | 0 | Bond option: x32 I/O configuration |
| 0 | 1 | 1 | Override bond option, force x16 I/O configuration |
| 1 | 0 | 1 | Bond option: x16 I/O configuration |
| 1 | 1 | 1 | Keep bond option as x16 I/O configuration |

Fig. 4c

| SDRAM Command | SDR Command Pins | | DDR CA Pins | | | | | | | | | | |
|---|---|---|---|---|---|---|---|---|---|---|---|---|---|
| | CK_t(n-1) | CK_t(n) | CS_N | CA0 | CA1 | CA2 | CA3 | CA4 | CA5 | CA6 | CA7 | CA8 | CA9 |
| | | | | | | | | | | | | | Clock Edge |
| | | | | | | | | | | | | | Rising Edge |
| | | | | | | | | | | | | | Falling Edge |
| | | | | | | | | | | | | | Rising Edge |
| | | | | | | | | | | | | | Falling Edge |
| MRW | H | H | L | L | L | L | L | MA0 | MA1 | MA2 | MA3 | MA4 | MA5 |
| | | | X | MA6 | MA7 | OP0 | OP1 | OP2 | OP3 | OP4 | OP5 | OP6 | OP7 |
| MRR | H | H | L | L | L | L | L | MA0 | MA1 | MA2 | MA3 | MA4 | MA5 |
| | | | X | MA6 | MA7 | X | X | X | X | X | X | X | X |

Fig. 5

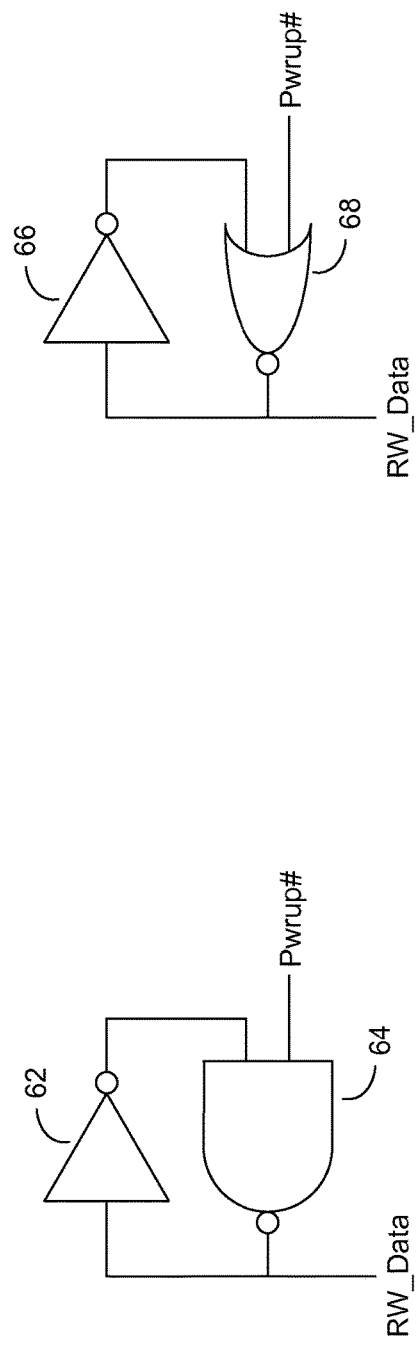
Fig. 13a  Fig. 13b  Fig. 13c  Fig. 13d

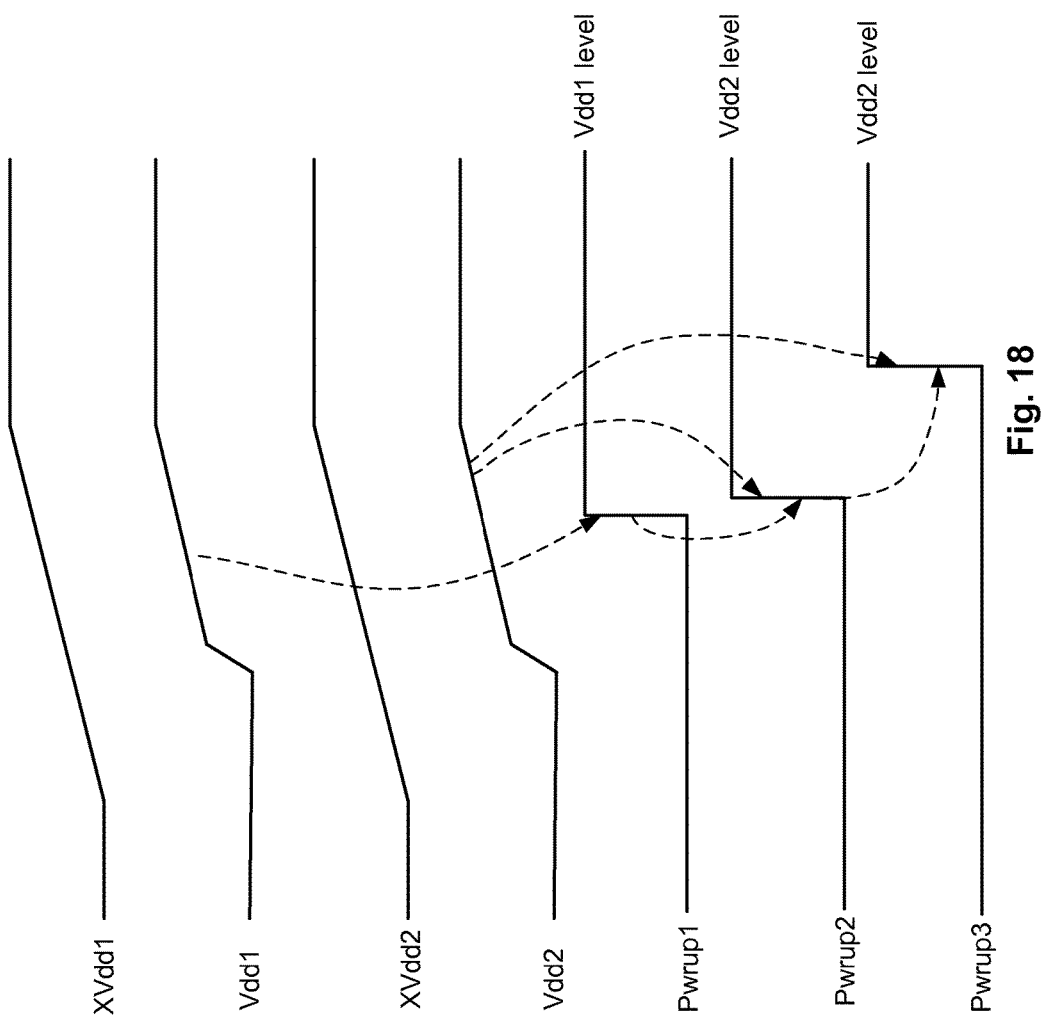

MEMORY DEVICE THAT SUPPORTS MULTIPLE MEMORY CONFIGURATIONS

FIELD OF INVENTION

The disclosure relates to a memory device, and, more particularly, to a memory device that supports multiple memory configurations.

BACKGROUND

Synchronous dynamic random access memory ("SDRAM") is dynamic random access memory ("DRAM") that is synchronized with a respective computer's system bus. In particular, SDRAM has a synchronous interface that waits for a system clock signal before responding to control inputs. The clock signal is used to drive an internal finite state machine that pipelines incoming commands. The data storage area is divided into several banks, allowing the memory device to work on several memory access commands at a time. This allows for higher data access rates than with asynchronous DRAM memory chips.

SDRAM is widely used in computers and mobile computing devices, including mobile phones, computing tablets, global positioning systems, etc. Several generations of double data rate ("DDR") SDRAM have entered the mass market, including DDR1, DDR2, DDR3, and DDR4. The Joint Electron Device Engineering Council ("JEDEC"), an independent semiconductor engineering trade organization and standardization body, issues specification requirements for each of the generations of DDR SDRAM. The specifications for the above mentioned generations and any future generations of DDR SDRAM are incorporated herein by reference.

Mobile DDR (also known as mDDR, low power DDR, or LPDDR) is a type of double data rate synchronous DRAM for mobile smart phones, tablets, and other mobile computing devices. The first generation low power DDR (sometimes referred to as, "LPDDR1") is a slightly modified form of DDR SDRAM, with several changes to reduce overall power consumption. Most significantly, the supply voltage is reduced from 2.5V to 1.8V. Additional savings come from temperature-compensated refresh, partial array self-refresh, and a deep power down mode, which sacrifices memory contents. Later generations of LPDDR have been developed and marketed, including LPDDR2, LPDDR3, etc. The specifications for the above mentioned generations of LPDDRn and any future generations of LPDDRn are incorporated herein by reference.

Rambus' R+DDRn family of memory interface solutions provide improvements to LPDDRn devices. For instance, memory devices that implement R+LPDDR3 offer reduced power consumption, increased data rates, and improved cost-effectiveness. By incorporating innovations such as flex phase timing adjustment circuits, output driver calibration, on die termination ("ODT") calibration, and low-overhead multi-modal functionality, R+DDRn physical layers ("PHYs") deliver improved margin and flexibility to allow system designers to optimize a computer system for their unique requirements.

The R+LPDDR3 memory PHY is optimized for mobile applications and is fully compliant with the LPDDR3 specification. When paired with R+LPDDR3, the memory device can support data rates of up to 2400 Mbps with a roadmap up to 3200 Mbps, and is capable of reducing active memory system power by up to 25% and active DRAM power by up to 30%. The R+LPDDR3 solution can also enable a significantly improved thermal profile and an increased battery life for the end device that houses the R+LPDDR3 memory device. As a consequence of the improved the thermal profile, the end device is able to run the memory system at peak bandwidth for longer periods of time which translates to better overall performance in the end device.

In order to take advantage of any one of the types of DDR SDRAM technologies, the end device must be specifically engineered to use one of the types of DDR memory configurations. This can be expensive for DDR SDRAM manufactures since each different system may use a different type of DDR SDRAM. For instance, one system may use LPDDR2, another system might use LPDDR3, yet another system might use R+LPDDR3, and further yet another system might use LPDDR4. This would mean that a DDR SDRAM manufacturer would need to make various memory devices to match each of the different systems.

Therefore, there exists a need to provide a new memory device that supports multiple DDR SDRAM memory configuration modes. Furthermore, there exists a need to provide methods for selecting one of the memory configuration modes to operate the memory device. Other refinements for a memory device to conserve power and to prevent transistor latch up that can apply to any IO specification and configuration are also desirable.

SUMMARY OF INVENTION

Briefly, the disclosure relates to a memory device, comprising: a plurality of memory configuration modes, features, and product specification; an option selection logic for selecting one of the plurality of memory configuration modes to operate the memory device on the fly under normal operation inside a system; and bonding pads, wherein the bonding pads are connected to inputs of the option selection logic. The bonding pads are configurable such that the selected one of the plurality of memory configuration modes is selected as a function of the configured bonding pads.

DESCRIPTION OF THE DRAWINGS

The foregoing and other aspects of the disclosure can be better understood from the following detailed description of the embodiments when taken in conjunction with the accompanying drawings.

FIGS. 3a-3c illustrate an embodiment for an option selection logic for selecting memory configuration modes of the present disclosure.

FIGS. 4a-4d illustrate another embodiment for an option selection logic for selecting memory configuration modes of the present disclosure.

FIG. 5 illustrates a table listing command pins for a memory device of the present disclosure.

FIGS. 13a-13d illustrate block diagrams of latches of the present disclosure.

FIG. 18 illustrates a graph of external voltages, internal voltages, and powering up voltages for a memory device of the present disclosure.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced.

The present disclosure discloses a high density, high performance, low power synchronous DRAM memory device having multiple interface specifications (e.g., multiple memory configurations or modes) while using the same external pins for each of the different interface specifications. For instance, low power double data rate 2 ("LPDDR2"), low power double data rate 3 ("LPDDR3"), and R+low power double data rate 3 ("R+LPDDR3") command control and data path logic with a high performance memory core can be combined for use in the same memory device. The I/O interface and voltage swing can be selected on the fly while operating the memory device. The memory core can have several unique features that allow for low power and high throughput memory access. The present disclosure can also provide for a design for test ("DFT") features that can reduce test time, provide testing flexibility, and ensures product reliance.

A semiconductor memory device, e.g., a DRAM device, includes a region having a plurality of memory banks. This region of memory banks can be referred to as a memory core. Typically, data read/write buses which can be separate data read ("DR") lines and data write ("DW") lines, or multiplexed data read and write ("DRW") lines.

A typical DRAM can comprise eight storage banks or more, e.g., bank 0, bank 1, etc. The memory core consists of 8 or more storage banks. Each of the banks can comprise bit-lines, word-lines, memory storage elements, bit-line sense amplifiers, local and global row decoders, column decoders, etc. Each storage bank can respond to a data read/write command to or from that storage bank.

Figure 1A:
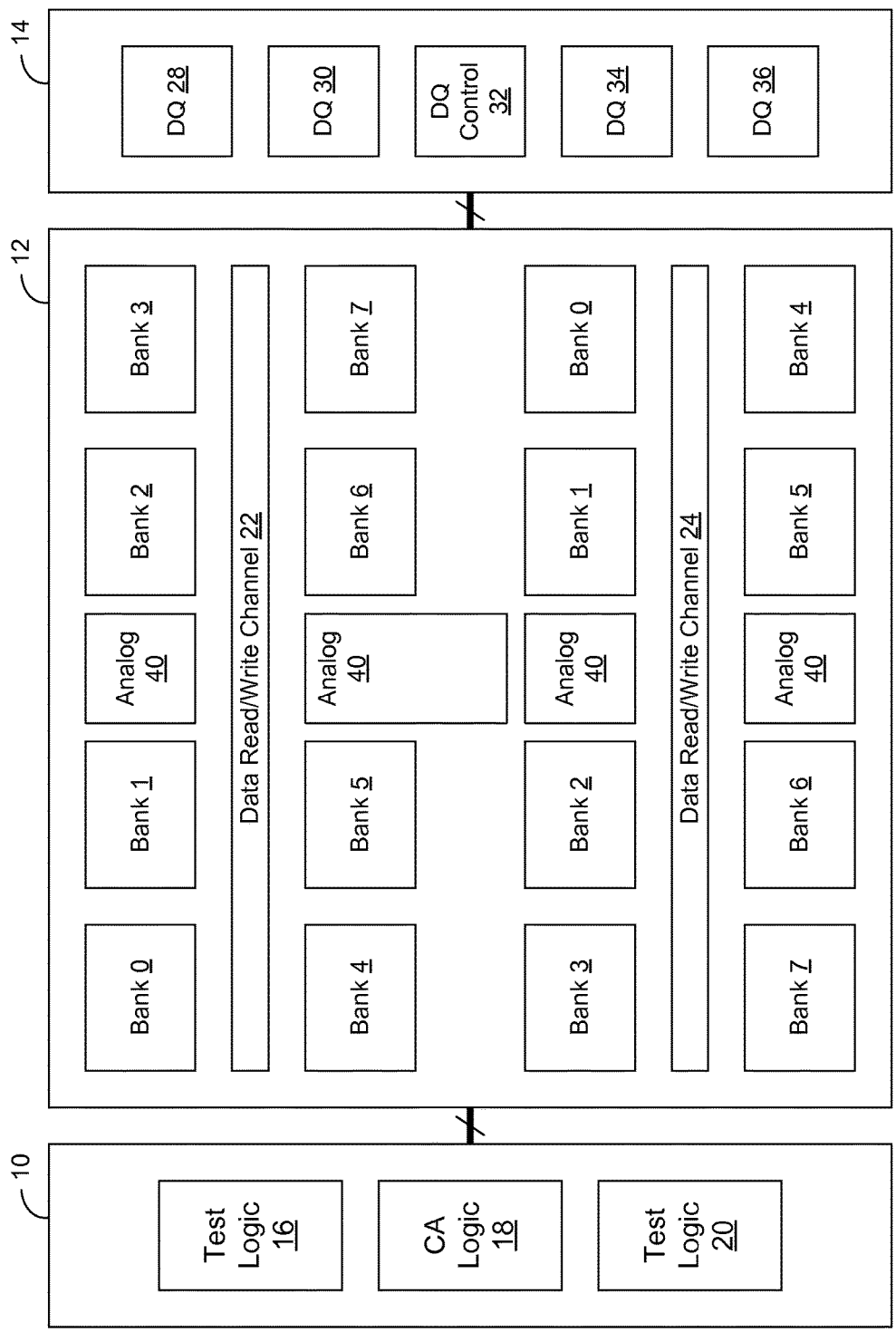
FIGS. 1a-1e illustrate various embodiments of a memory device of the present disclosure having storage sub-banks.

FIG. 1a illustrates a block diagram of a memory device of the present disclosure having storage sub-banks A memory device of the present disclosure comprises a command block 10, a memory core 12, data read/write channels 22 and 24, and an input/output ("DQ") block 14. The DRW channels 22 and 24 can be multiplexed data read and write buses.

The command and address block 10 can further comprise test logics 16 and 20 and command and address logic 18. The test logics 16 and 20 can comprise internal test mode control circuitry for testing the respective memory device. The command and address logic 18 comprises circuitry to process commands and addresses for the respective memory device.

The memory core 12 comprises eight storage banks, i.e., storage banks 0, 1, 2, 3, 4, 5, 6, and 7. Each of the storage banks 0-7 can comprise a first one-half sub-bank and a second one-half sub-bank. The first one-half sub-banks of the storage banks 0-7 and the second one-half sub-banks of the storage banks 0-7 are connected to the DQ block 14 by DRW channels 22 and 24. The one-half sub-banks of the storage banks 0-7 are arranged in a 4×4 array. The first one-half sub-banks of the storage banks 0-7 are arranged in the upper half of the 4×4 array, i.e., rows 1 and 2 of the array. The second one-half sub-banks of the storage banks 0-7 are arranged in the lower half of the 4×4 array, i.e., rows 3 and 4 of the array. The DRW channel 22 is routed between rows 1 and 2 of the 4×4 array to connect to the first one-half sub-banks of the storage banks 0-7 to the DQ block 14. The DRW channel 24 is routed between rows 3 and 4 of the 4×4 array to connect to the second one-half sub-banks of the storage banks 0-7 to the DQ block 14.

Since the DRW channels 22 and 24 have sub-banks on either side of their physical location, the distances from the sub-banks to their respective DRW channels 22 and 24 can be around the same length for each of the storage banks. Thereby, power consumption to access each one of the storage banks would be similar regardless of which storage bank was accessed since the sub-banks for each storage bank are disposed in the memory core 12 to be a similar total distance away from the DQ block 14.

If the array of sub-banks were to be expanded to an N×N array of sub-banks, then every two rows of sub-banks can be connected to a different data read/write channel. The respective data read/write channels can be located between every two rows of the N×N array so that the upper sub-banks and lower sub-banks are substantially around the same distance to their respective data read/write channel. By having the distance substantially around the same to access each storage bank, power consumption can be more predictable and symmetric across data read/write commands at various storage banks.

The first one-half and the second one-half sub-banks of the storage banks 0-7 are arranged in the array relative to the DQ block 14 such that the relative distance to access a storage bank does not substantially vary from one storage bank to the next storage bank. For a 4×4 array of sub-banks, if a certain storage bank has one sub-bank located in the first column of the array, then the certain storage bank will have its respective second sub-bank located in the fourth column. If that certain storage bank has a sub-bank located in the second column of the array, then the certain storage bank's other respective sub-bank will be located in the third column. The sub-banks of the storage bank are located in the array at symmetrical positions about a center position of the array.

For instance, the first one-half sub-bank of the storage bank 0 is located in the first column of the array and the second one-half sub-bank of the storage bank 0 is located in fourth column (or last column) of the array. When data is read to the storage bank 0, both sub-banks of storage bank 0 are simultaneously accessed. The data can be split and read to the first one-half sub-bank via the data read/write channel 22 and to the second one-half sub-bank via the data read/write channel 24.

In this scheme, since both sub-banks of a storage bank are accessed, the distance between the sub-banks and the DQ block will not be substantially different compared to other distances between other storage banks and the DQ block. By having these distances between the storage banks and the DQ block relatively similar, the average power usage or current usage to read or write data between any storage bank and the DQ block should roughly consume about the same amount of energy or relatively close to the same amount of energy since the sub-banks for each storage bank are about the same distance from an DQ block of the respective memory device.

In an extreme case without the above scheme, both the first one-half sub-bank of the storage bank 0 and the second one-half sub-bank of the storage bank 0 can be in column 1. Data would have to traverse the furthest distance on the DRW channels 22 and 24 to transfer data to/from storage bank 0 compared to the other storage banks that are not positioned in the first column. If both the first one-half sub-bank of the storage bank 0 and second one-half sub-bank of the storage bank 0 are in column 4, then both the data to these sub-banks will traverse the smallest distance on the DRW channels to transfer data to/from storage bank 7 relative to the other storage banks that are not positioned in the fourth column. Due to these varying distances, the power consumption to make the data transfers from/to the storage bank 0 and storage bank 7 will be vastly different, leading to asymmetrical power consumption.

The memory core 12 may further comprises analog blocks 40 to provide various reference voltages to the storage banks 0-7 and the data read/write channels 22 and 24. The analog blocks 40 can comprise typical components for the memory device, including voltage generators, detectors, other power generator circuits, clamp circuits, etc. There can be other power requirements for the memory device which the analog blocks 40 can provide depending on the design and specification of the memory device.

It is understood by a person having ordinary skill in the art that any number of storage banks and/or any size sub-bank can be used to implement the present disclosure. To aid in the understanding of the invention, eight storage banks, each having two half banks, are described to convey the concepts of the present disclosure. However, other numbers of storage banks and/or any number of sub-banks can be used in conjunction of the present disclosure. For example, sixteen storage banks can be used, each having four sub-banks (i.e., a one-quarter sub-bank). It is the intention that other variations in the number of storage banks and/or the number of sub-banks are included in the present disclosure. In addition, the array size of the sub-banks can likewise be extended to an N×N array of sub-banks, where N can be an even integer. Data read/write channels can be routed between every two rows of sub-banks to the DQ block.

The data read/write channels 22 and 24 route data between the DQ block 14 and the storage banks 0-7. The DQ block 14 comprises a data in/data out ("DQ") control block 32 and DQ blocks 28, 30, 34, and 36. The DQ blocks 28, 30, 34 and 36 each comprise data in and out circuitry for particular byte units. The DQ control block 32 can control the timing for global writes (i.e., data-in) and reads (data-out) of the DQ blocks 28, 30, 34, and 36. Thereby, the DQ blocks 28, 30, 34, and 36 can follow control signals from the command block 18. Each of the DQ blocks 28, 30, 34, and 36 comprises data-input/output buffers that are controlled by control signals from the DQ control block 32. The DQ blocks 28, 30, 34, and 36 are assigned to different byte numbers.

For instance, the DQ block 28 provides circuitry and pads related to bits 24-31 of a 4-byte data word. The DQ block 30 provides circuitry and pads related to bits 8-15 of the 4-byte data word. The DQ block 34 provides circuitry and pads related to bits 0-7 of the 4-byte data word. The DQ block 36 provides circuitry and pads related to bits 16-23 of the 4-byte data word. In particular, the DQ blocks 28, 30, 34, and 36 include the I/O related circuits for their respective bytes, including output drivers, pads, power sources, and output control logics, and other circuitry for the respective bytes of the DQ blocks.

Thus, each DQ block 28, 30, 34, and 36 is responsible for one byte of the four byte word. The physical location of the DQ blocks 28, 30, 34, and 36 are important so that power consumption is minimized. The first one-half sub-banks of the storage banks 0-7 are connected to the DQ blocks 28 and 30 such that only the bits 24-31 and 8-15 of any data word is stored in the first one-half sub-banks of the storage banks 0-7. Furthermore, since the location of the first one-half sub-banks of the storage banks 0-7 are in the upper half of the memory core 12, the DQ blocks 28 and 30 can also be located in an upper half of the DQ block 14 to allow for a more direct connection to the DRW channel 22. Likewise, the second one-half sub-banks of the storage banks 0-7 are connected to the DQ blocks 34 and 36 such that only the bits 16-23 and 0-7 of any data word is stored in the second one-half sub-banks of the storage banks 0-7. Furthermore, since the location of the second one-half sub-banks of the storage banks 0-7 are in the lower half of the memory core 12, the DQ blocks 34 and 36 can also be located in a lower half of the DQ block 14 to allow for a more direct connection to the DRW channel 24.

The DQ block 14 comprises the DQ blocks 28, 30, 34, and 36, and is physically located to one side of the memory core 12. By having the DQ block 14 on one side, a symmetric design can be applied to the sub-banks to allow for symmetric power usage for reads and writes across different storage banks. Typically, the command block 10 can be on an opposite side of the DQ block 14. However, various configurations can be gleamed from the present disclosure. For instance, the DQ block 14 may be located on a perpendicular side relative to the DQ block 14. Alternatively, the DQ block 14 may be split across two opposite sides such that the DQ block 28 and 30 are on one side of the memory core 12 and the DQ blocks 34 and 36 are on an opposite side relative to the memory core 12.

Figure 1B:
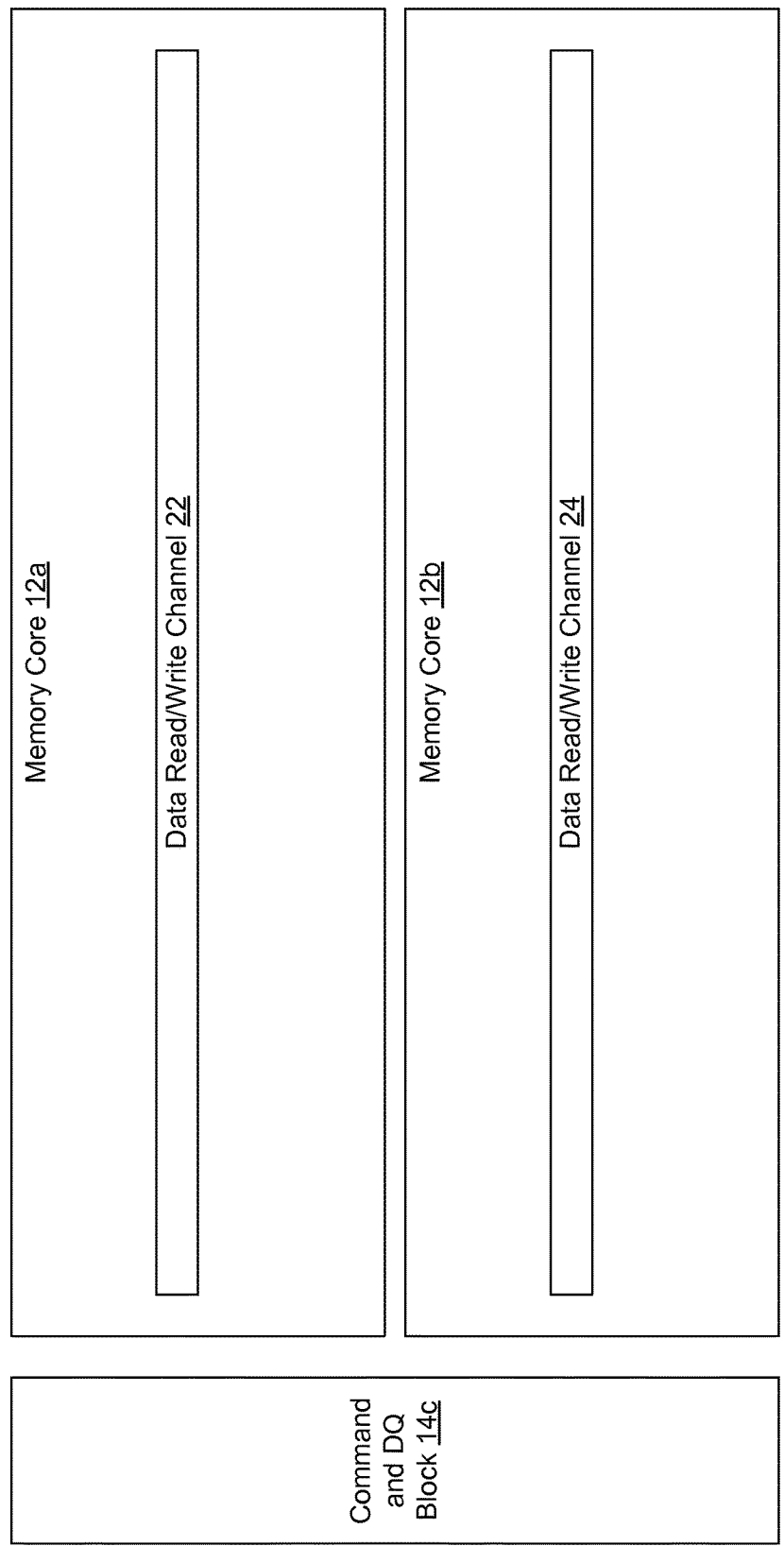

FIG. 1*b* illustrates a block diagram of another embodiment of a memory device of the present disclosure having multiple banks In accordance with the present disclosure, the command and address ("CA") block 10 and the DQ block 14 can be disposed in various locations relative to the memory core 12. For instance, the functionality of the DQ block 14 and the command block 10 can be merged to form a command and DQ block 14*c*, located on a single side of the memory core 12. The sub-banks can be split into two groups, with one group of sub-banks located in memory core 12a and the other group of sub-banks located in memory core 12b. Since the command and DQ block 14c is disposed at one end of the DRW channels 22 and 24, the distances from the storage banks to the command and DQ block 14c can be set to be around the same distance by positioning of the sub-banks along the columns of the memory cores 12a and 12b (or alternatively along the rows, depending on the orientation of the DRW channels 22 and 24 and the DQ block 14c).

Figure 1C:
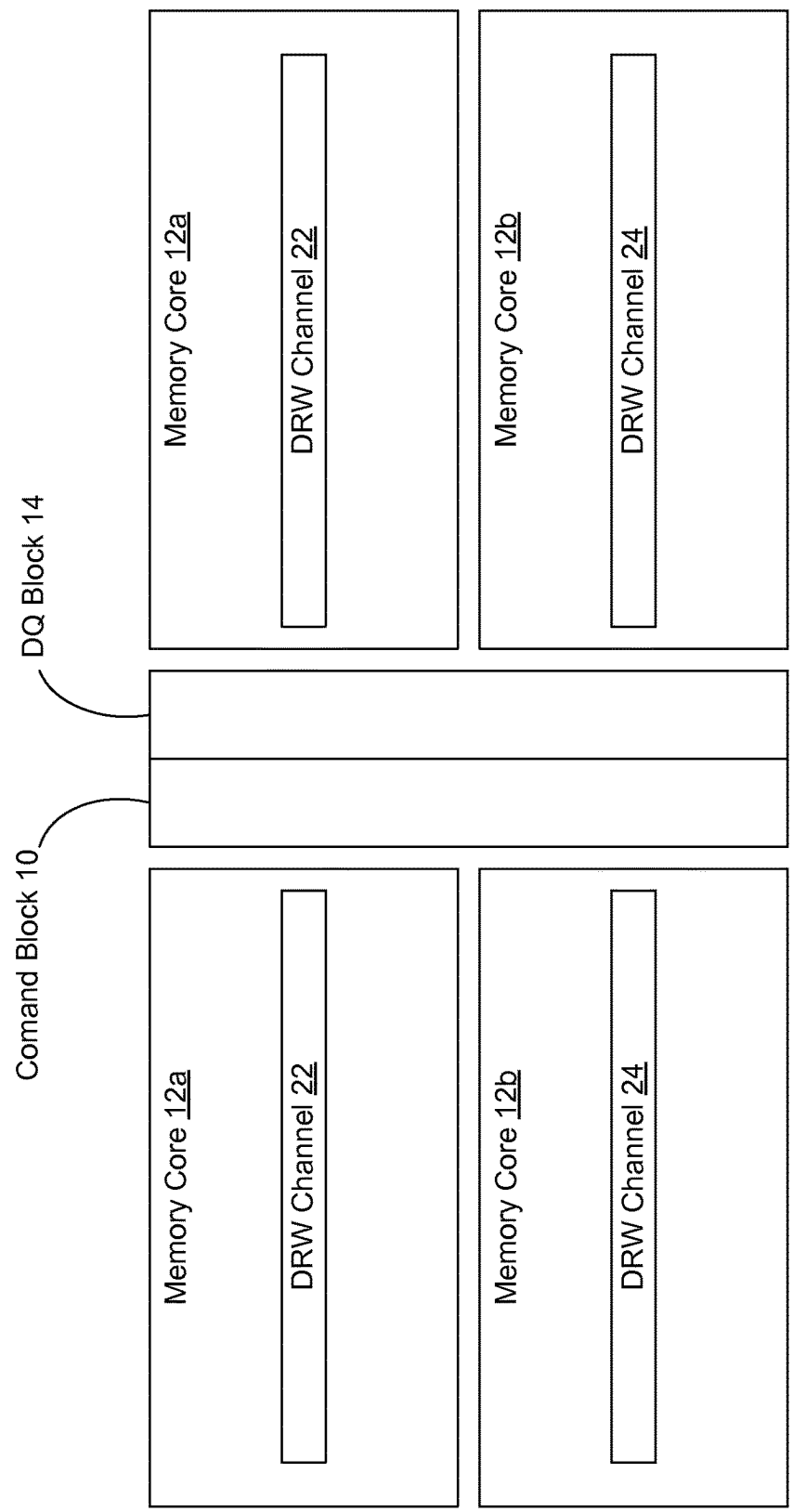

FIG. 1c illustrates a block diagram of yet another embodiment of a memory device of the present disclosure having storage sub-banks In other embodiments of the present disclosure, the command block 10 and the DQ block 14 can be disposed in the middle of the memory core 12 with DRW channels 22 and 24 running along either side of the command block 10 and the DQ block 14. Since the DQ block 14 is disposed in the middle of the memory core with the DRW channels 22 and 24 on either side, the distances from the storage banks to the DQ block 14 can be set to be around the same distance by the positioning of the sub-banks along the columns about the DQ block 14 (or alternatively, along the rows, depending on the orientation of the DRW channels 22 and 24 and the DQ block 14 relative to the memory core 12). The sub-banks can be split into two groups, with one group of sub-banks located in the memory core 12a and the other group of sub-banks located in the memory core 12b.

Figure 1D:
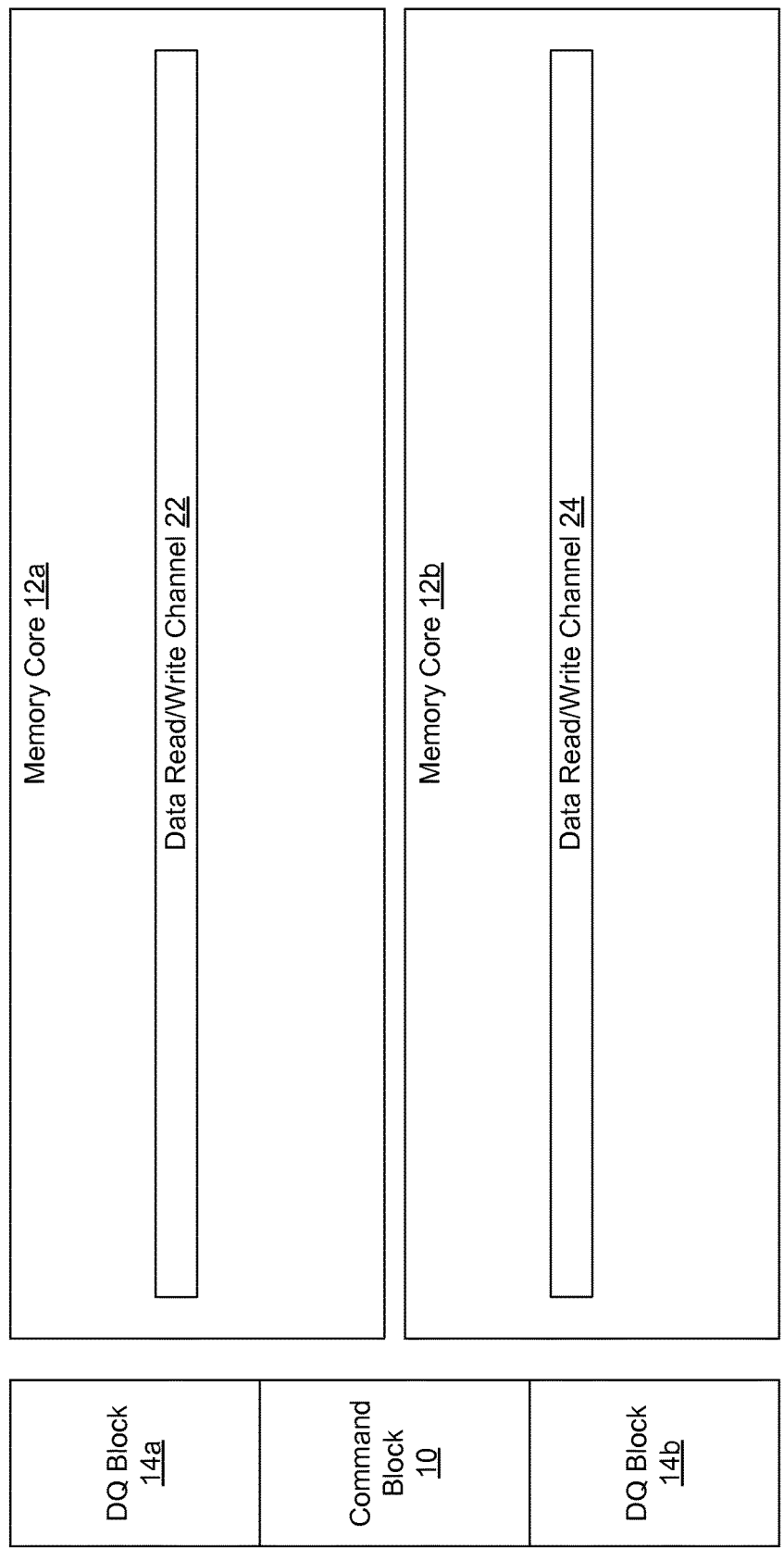

FIG. 1d illustrates a block diagram of an additional embodiment of a memory device of the present disclosure having multiple banks. The command block 10 and the DQ block 14 can be disposed in various locations relative to the memory core 12 in accordance with the present disclosure. For instance, the DQ block 14 and the command block 10 can be located on the same side relative to the memory core 12. The DQ block 14 can be split into two distinct blocks DQ block 14a and DQ block 14b, where DQ block 14a receives data from or outputs data to the DRW channel 22 and the DQ block 14b receives data from or outputs data to the DRW channel 24. The command block 10 can be disposed on the same side as the DQ blocks and between the DQ block 14a and 14b. Since the DQ blocks 14a and 14b are disposed at one end of the DRW channels 22 and 24, the distances from the storage banks to the DQ blocks 14a and 14b can be set to be around the same distance by the positioning of the sub-banks along the columns of the memory core 12 (or, alternatively, positioning of the sub-banks along the rows, depending on the orientation of the DRW channels and the DQ blocks 14a and 14b). The sub-banks can be split into two groups, with one group of sub-banks located in the memory core 12a and the other group of sub-banks located in the memory core 12b.

As understood by a person having ordinary skill in the art, there are numerous embodiments for the physical layout of a memory device based on the present disclosure. The aforementioned examples are not meant to be limiting in any manner and only serve to highlight a few of those embodiments disclosed in the present disclosure.

Figure 1E:
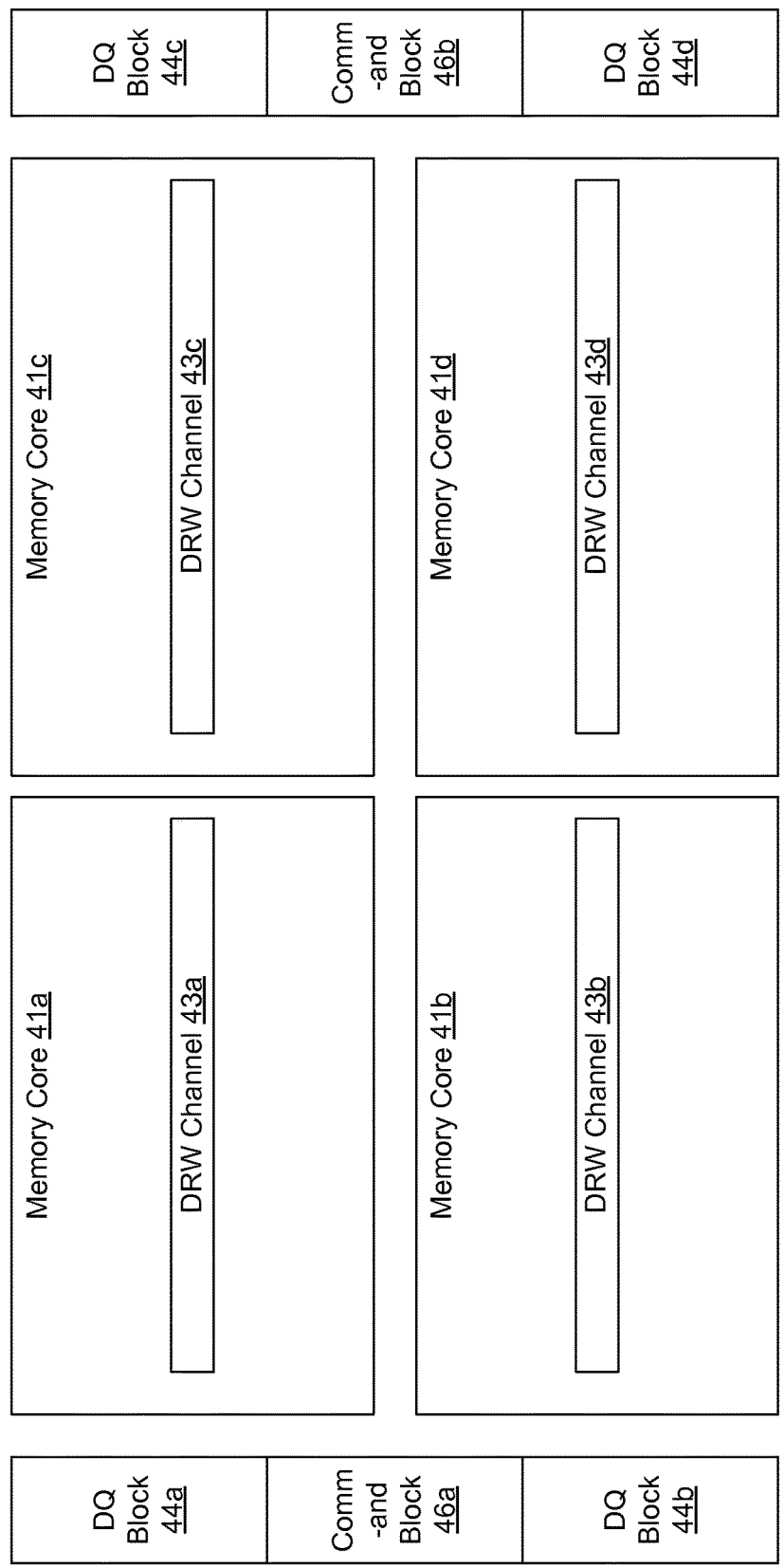

FIG. 1e illustrates yet another embodiment of a memory device of the present disclosure having storage sub-banks In an LPDDR4 memory core, the memory core may have four distinct areas 41a-41d of the memory core. The memory cores 41a-41d can be separated into two groups, one group of memory core 41a and 41b and a second group of memory core 41c and 41d. For each group of the memory cores, there are DQ blocks and a command and address block to write data to or read data from each group of memory cores. In particular, DQ block 44a reads data from and writes data to the memory core 41a via DRW channel 43a; DQ block 44b reads data from and writes data to the memory core 41b via DRW channel 43b; and the command and address block 46a serves to control and operate the DQ blocks 44a and 44b and the memory cores 41a and 41b. Also, DQ block 44c reads data from and writes data to the memory core 41c via DRW channel 43c; DQ block 44d reads data from and writes data to the memory core 41d via DRW channel 43d; and the command and address block 46b serves to control and operate the DQ blocks 44c and 44d and the memory cores 41c and 41d. As illustrated, the present disclosure can be expanded to any number of memory cores, DQ blocks, and command and address blocks. The present embodiments are merely examples of the various configurations of the memory device based upon the present disclosure.

Figure 2:
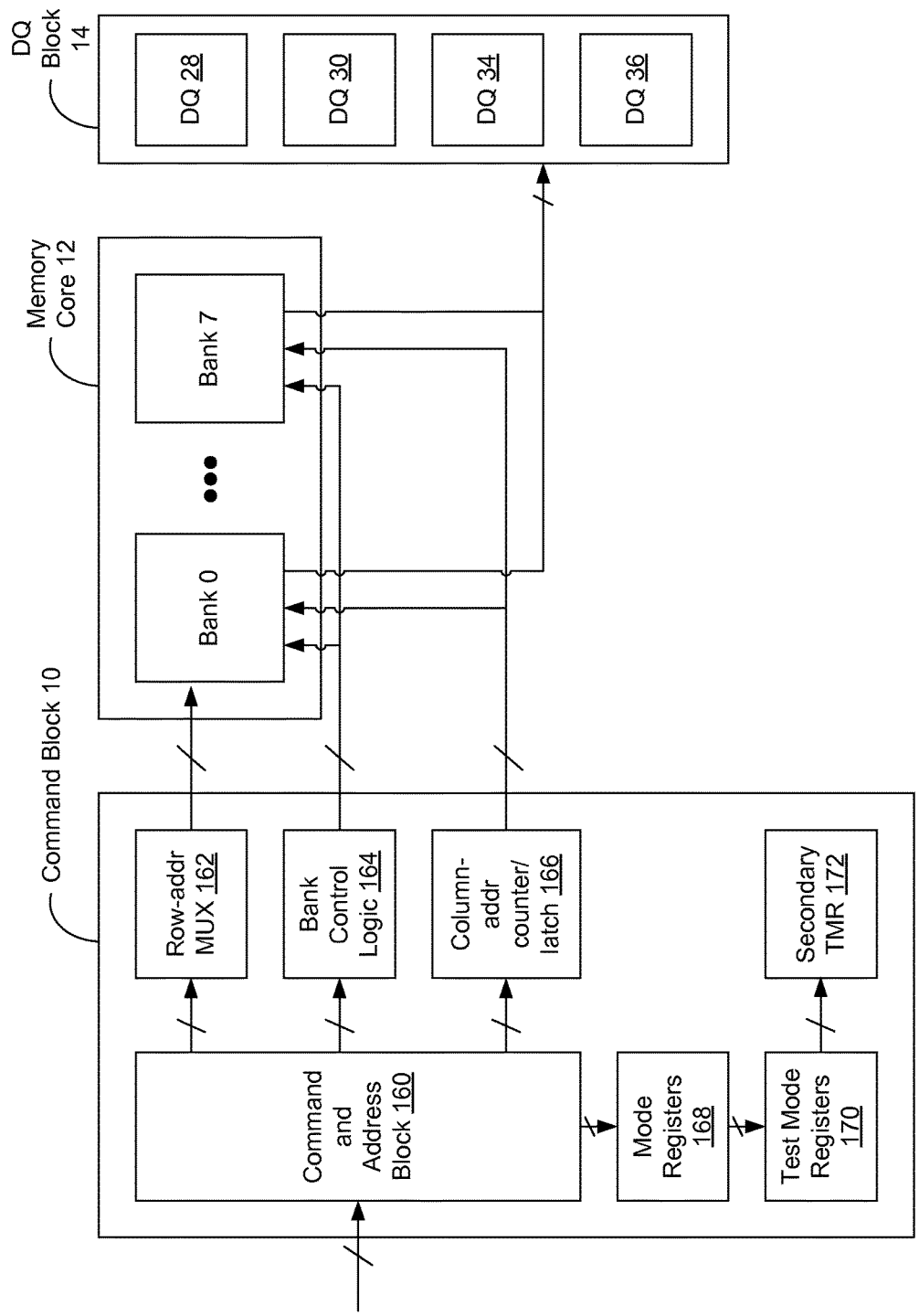
FIG. 2 illustrates data paths for a memory device of the present disclosure.

FIG. 2 illustrates data paths for a memory device of the present disclosure. The command block 10 can comprise a command and address block 160, a row address multiplexer ("row-addr mux") 162, a bank control logic 164, a column address counter and latch block 166, mode registers 168, test mode registers ("TMRs") 170, and secondary TMRs 172. Commands and addresses for data can be inputted to the command and address block 160. The address of the data is transmitted to the memory core 12 to retrieve from or write data to the memory core 12 via the row-addr mux 162, bank control logic 164, and column-addr counter/latch 166. The row-addr mux 162, bank control logic 164, and column-addr counter/latch 166 can control the operation of the memory core 12 by activating one of the storage banks 0-8 to store data to or to read data from.

Once the memory core 12 is activated by the command block 10, data can be read from the memory core 12 to the DQ block 14. Alternatively, data can be read from the DQ block 14 and written to the memory core 12 depending on whether the command block 10 receives a read command or write command. Command and address bock 160 can also be used to write commands to the mode registers 168, TMRs 170, and secondary TMR 172. The test mode registers can be the same as the regular mode registers except the TMRs are enabled using a mode register 9 ("MR9"). The MR9 is discussed in the JEDEC document JESD209-3B, which is incorporated by reference. The MR9 can be used with predefined OP codes that allow the TMRs to become available for use. Within each of the TMRs modes, additional registers can be written using operational ("OP") codes, e.g., OP0 through OP7, to decode and enable more test modes.

FIG. 3a illustrates a table listing bond pad configurations and mode register commands for selecting a memory configuration mode of a memory device of the present disclosure. The following memory configuration modes, LPDDR3, LPDDR2, and R+LPDDR3, can be used by a memory device of the present disclosure. Each of these memory configuration modes can read or write data words of either 32 bits or 16 bits. Thus, there can be six possible permutations of distinct memory configuration modes.

The memory device can have one of the memory configuration modes selected by bonding bond pads of the memory device to predefined voltage values. Bonding pad configurations can be assigned to specific ones of the memory configuration modes. For instance, by bonding bond pad XOPTR, bond pad XOPTP2, and bond pad XOPT16 to a voltage Vss (or ground or logic 0), the LPDDR3 in a 32 bit I/O memory configuration mode can be selected by an option selection logic (not shown) for use in by the memory device. Alternatively, if the bond pad XOPTR is bonded to a voltage XVdd2 and bond pad XOPTP2 and bond pad XOPT16 are bonded to the voltage Vss, the R+LPDDR3 is selected by the option selection logic in a 32 bit I/O memory configuration mode. Other bonding selections can be bonded to set the memory device to another memory configuration with another number of bits for input and output. The bonding of bond pads XOPTR, XOPTP2, and/or XOPT16 can be used to set a default memory configuration mode to use for the respective memory device.

If a different memory configuration mode is desired, the default memory configuration mode can be overridden using mode register ("MR") commands or test mode register commands. For instance, in an embodiment of the present disclosure, the LPDDR3 and 32 bits input/output configuration mode can be the initial default setting which is set by bonding. If the memory device is placed in a LPDDR2 system, then the memory configuration for the memory device must be overwritten to run the LPDDR2 memory configuration mode. A predefined MR command can be inputted to the memory device to change the memory configuration mode from LPDDR3 to LPDDR2.

For instance, a mode register command 155 ("MR155), which can also be a test mode register command 27 ("TMR27"), having operational codes of bits 6, 5, and 4 can be used to override the default memory configuration mode to another memory configuration mode. If bit 4 of the op code is in a logic high state, then LPDDR2 can be selected by the option selection logic of the memory device. If bit 5 of the op code is in a logic high state, then R+LPDDR3 can be selected by the option selection logic of the memory device. If bit 6 of the op code is in a logic high state, then the 16 bit input and output mode is selected.

The number of memory configuration modes can vary depending on the design of the respective memory device. The examples described herein are not meant to limit the present disclosure to these specific embodiments, but to merely illustrate the underlying concepts of the present disclosure. Furthermore, specific mode register commands to override default memory configuration modes and bonding configurations associated to particular memory configuration modes are merely examples and can be altered depending on the design of the memory device. Therefore, the present disclosure is meant to include other permutations of the number and types of memory configuration modes selected by bonding or overridden by MR commands.

Figure 3B:
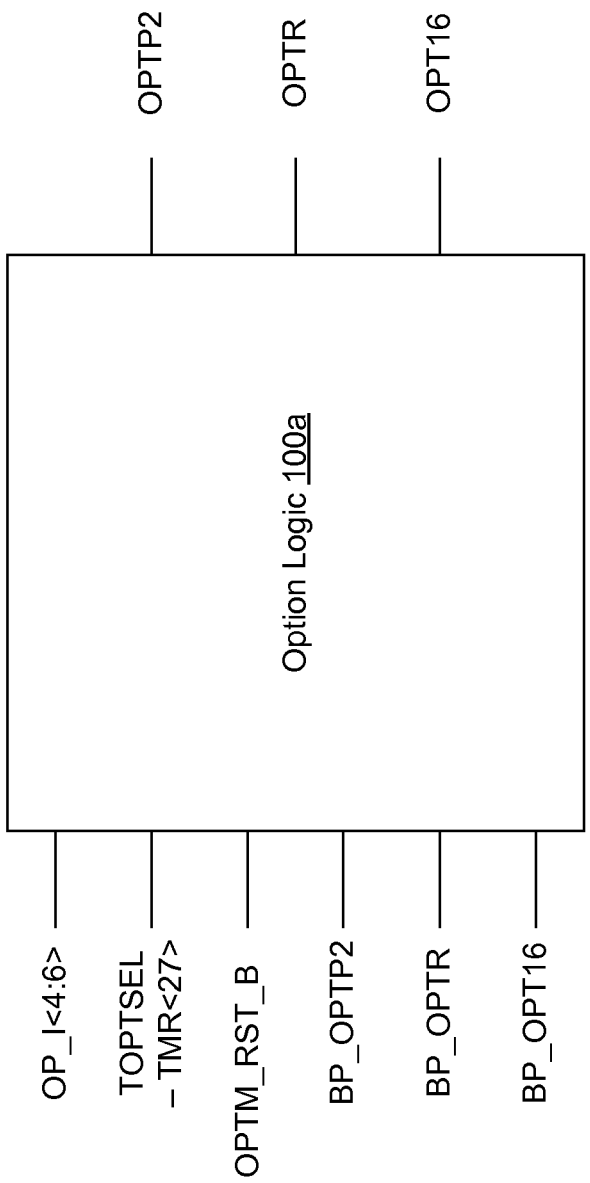

FIG. 3*b* illustrates an option selection logic 100*a* of the present disclosure for selecting a memory configuration mode. The option selection logic 100*a* can have the following inputs: op code bits OP_I<4:6>; mode register command TOPTSEL; a reset command OPTM_RST_B; a bond pad signal BP_OPTP2 from the bond pad XOPTP2; a bond pad signal BP_OPTR from the bond pad XOPTR; and a bond pad signal BP_OPT16 from the bond pad XOPT16. The option selection logic 100*a* can output the following signals OPTP2, OPTR, and OPT16 to select one of the memory configuration modes in accordance with the table shown in FIG. 3*a*.

Figure 3C:
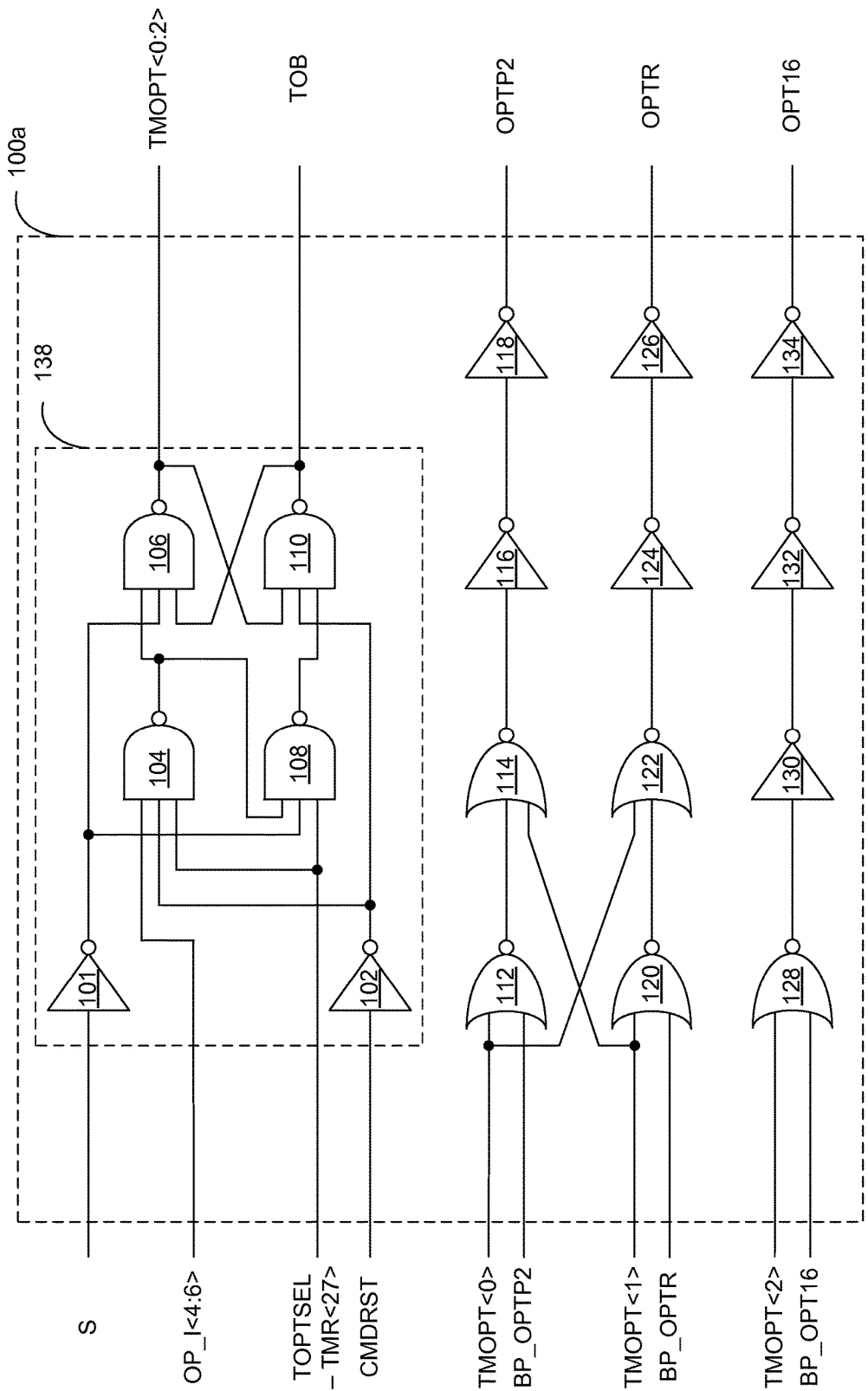

FIG. 3*c* illustrates a diagram for an option selection logic of the memory device of the present disclosure. The option selection logic 100*a* comprises inverters 101, 102, 116, 118, 124, 126, and 130-134, NAND gates 104-110, and NOR gates 112, 114, 120, 122, and 128. An additional set signal S can be inputted to the inverter 101, which can serve as a set-reset latch. The signal S can be tied to ground in this case. The output of the inverter 101 is inputted to the NAND gates 108 and 106.

The signal Op_I<4:6> is inputted to the NAND gate 104. The signal TOPTSEL is inputted to the NAND gates 104 and 108. The command and reset signal CMDRST is inputted to the inverter 102, and can be the same signal as the reset signal OPTM_RST_B. The inverter 102 outputs to the NAND gates 104 and 110. The output of the NAND gate 104 is inputted to the NAND gates 106 and 108. Another input of the NAND gate 106 is connected to the output of the NAND gate 110. The output of the NAND gate 110 generates the output signal TOB. One of the inputs of the NAND gate 110 is connected to the output of the NAND gate 106. The output of the NAND gate 106 generates the output signal TMOPT<0:2>. The output of the NAND gate 108 is connected to the input of the NAND gate 110.

There can be three latches ("TMR_lat") 138 referred to as latches IOPTMR<0>, IOPTMR<1>, and IOPTMR<2>. For simplicity, a single latch circuit is shown outputting the outputs of those latches, IOPTMR<0:2>. Each of the latches IOPTMR<0:2> generates corresponding output signals TMOPT<0>, TMOPT<1>, and TMOPT<2> signals that are applied to the NOR gates 112, 120, 128. The TOB node is not used in this implementation, but can be reserved for future use depending on the design of the respective memory architecture.

The NOR gates 112 and 114 and the inverters 116 and 118 are serially connected. The NOR gates 120 and 122 and the inverters 124 and 126 are serially connected. The input signal TMOPT<0> is connected to the input of the NOR gate 112 and 122. The input signal BP_OPTP2 is inputted to the NOR gate 112. The input signal TMOPT<1> is connected to the input of the NOR gate 120 and 114. The input signal BP_OPTPR is inputted to the NOR gate 120. The output of the inverter 118 generates the output signal OPTP2. The output of the inverter 126 generates the output signal OPTR. The signals TMOPT<2> and BP_OPT16 are inputted to a serially connected string of the NOR gate 128 and the inverters 130, 132, and 134 to generate the signal OPT16.

FIGS. 4*a*-4*c* illustrate tables listing bond pad configurations and mode register commands for selecting a memory configuration mode for another embodiment of a memory device of the present disclosure. The memory configuration modes used by the memory device of the present disclosure can comprise LPDDR4, LPDDR3, LPDDR2, and R+ mode for one of the LPDDRn configurations. Each of these memory configuration modes can be further set to read or write data words of either 32 bits or 16 bits. Bond pads can be bonded to select one of the LPDDRn configurations, whether the R+ mode is activated, and whether 16 bit or 32 bit I/O mode is selected. Any one of the bonding configurations can be overridden by a mode register command or test mode register command to reset the LPDDRn configuration, deactivate or activate the R+ mode, and/or select a 16 bit I/O configuration or a 32 bit I/O configuration.

The bond pads of the memory device receive the following signals BP_OPTP2, BP_OPTP3, BP_OPTR, BP_OPT16. The selected memory configuration mode can be initially selected based on the signals applied to the bond pads. For instance, if BP_OPTP2=1 and BP_OPTP3=0, then the LPDDR2 memory configuration mode is selected. If BP_OPTP2=0 and BP_OPTP3=0, then the LPDDR4 memory configuration mode is selected. Similarly, if BP_OPTR=0, then R+ mode is not enabled. If BP_OPTR=1, then R+ mode is enabled. If BP_OPT16=0, then the 32 bit mode is selected based on the bonding option. If BP_OPT16=1, then the 16 bit mode is selected based on the bonding option.

The selected bonded options can be overridden by using test mode ("TM") commands that provide the following input signals TM_OPTP2, TM_OPTP3, TM_OPTR, and TM_OPT16. The current bonded configuration and the input signals from the TM commands can be inputted to an option selection logic to output selection signals OPTP2, OPTP3, OPTR, and OPTR16. The output selection signals can override any previous memory configuration mode that was selected using the bond pads of the memory device.

For instance, if the output signals OPTP2=0 and OPTP3=0, then the LPDDR4 memory configuration mode is selected. If the output signals OPTP2=0 and OPTP3=1, then the LPDDR3 memory configuration mode is selected. If the output signals OPTP2=1 and OPTP3=0, then the LPDDR2 memory configuration mode is selected. If the output signal OPTR=0, then the memory configuration mode selected by the bond configuration is used. If the output signal OPTR=1, the R+ mode is enabled. If the output signal OPT16=0, then the 32 bit I/O mode selected by the bond configuration is used. If the output signal OPT16=1, then the 16 bit I/O mode is used.

Figure 4D:
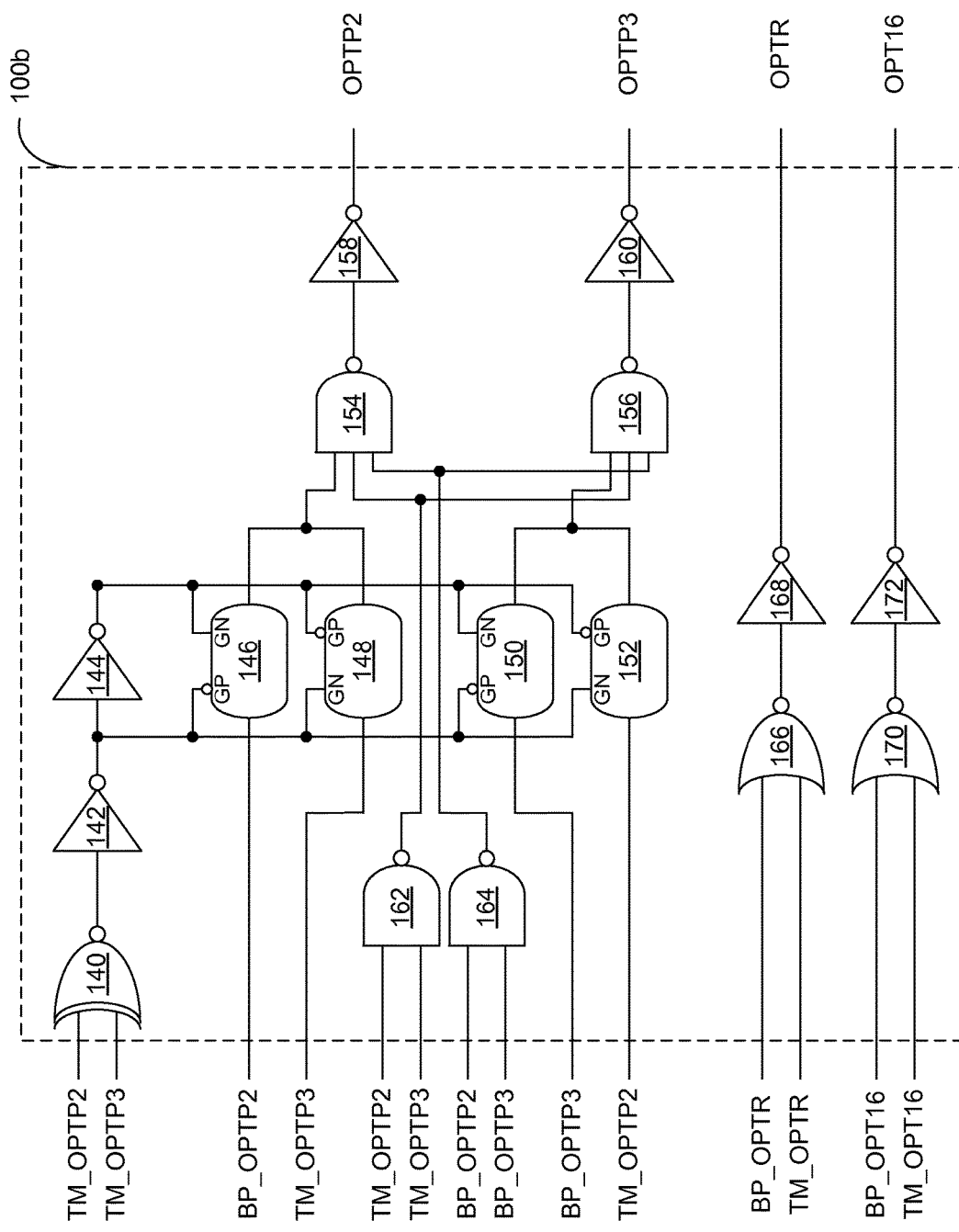

FIG. 4*d* illustrates another embodiment of an option selection logic of the present disclosure for selecting a memory configuration mode. An option selection logic 100*b* comprises multiplexers ("muxes") 146-152, XNOR gate 140, inverters 142, 144, 158, 160, 168, 172, NAND gates 154 156, 162, and 164, and NOR gates 166 and 170. The option selection logic 100*b* provides the output signals OPTP2, OPTP3, OPTR, and OPT16 based on the input signals TM_OPTP2, TM_OPTP3, BP_OPTP2, BP_OPTP3, BP_OPTR, TM_OPTR, BP_OPT16, and TM_OPT16. The tables shown in FIGS. 4*a*-4*c* list the input values and output values for the option selection logic 100*b*. A person having ordinary skill in the art can provide other equivalent implementations to generate the outputs signals based on the input signals as listed in FIGS. 4*a*-4*c*. The option selection logic 100*b* is meant to be merely an illustrative example, and is not meant to be limiting in any way.

The muxes 146-152 each comprise NMOS and PMOS transistors connected in parallel. The PMOS gate is identified by a symbol GP and the NMOS gate is identified by a symbol GN. If either TM_OPTP2 or TM_OPTP3 are logic high, i.e., 1, the respective muxes will select itself (i.e., TM_OPTP2 and TMOPT3), but not both which can be defined as an illegal operation.

The input signals TM_OPTP2 and TM_OPTP3 are inputted to the XNOR gate 140. The output of the XNOR gate 140 is connected to the serially connected inverters 142 and 144. The blocks 146-152 are connected in parallel with the inverter 144. The input of the block 146 is the signal BP_OPTP2. The block 146 outputs a signal to the NAND gate 154. The input of the block 148 is the signal TM_OPTP3. The block 148 outputs a signal to the NAND gate 154. The input of the block 150 is the signal BP_OPTP3. The block 150 outputs a signal to the NAND gate 156. The input of the block 152 is the signal TM_OPTP2. The block 152 outputs a signal to the NAND gate 156.

The input signals TM_OPTP2 and TM_OPTP3 are inputted to the NAND gate 162. The output of the NAND gate 162 is inputted to the NAND gates 154 and 156. The input signals BP_OPTP2 and BP_OPTP3 are inputted to the NAND gate 164. The output of the NAND gate 164 is inputted to the NAND gates 154 and 156. The NAND gate 154 outputs to the input of the inverter 158 to generate the output signal OPTP3. The NAND gate 156 outputs to the input of the inverter 160 to generate the output signal OPTP3.

The input signals BP_OPTR and TM_OPTR are inputted to the serially connected NOR gate 166 and the inverter 168 to generate the output signal OPTR. The input signals BP_OPT16 and TM_OPT16 are inputted to the serially connected NOR gate 170 and the inverter 172 to generate the output signal OPT16.

FIG. 5 illustrates a table listing command pins for a memory device for mode register write commands and read commands. The SDR commands pins CK_t(n−1), CK_t(n), and CS_N and the DDR commands pins CA0-CA9 can be assigned to specific mode registers based on the clocking edge and based on the voltage value sensed at those command pins.

The voltage values sensed at the command pins can be stored to the memory device's mode registers, which control various operating modes of the memory device. For instance, the mode registers can be used to program column access strobe ("CAS") latency, addressing mode, burst length, test mode, delay lock loop ("DLL") reset, and various vendor specific options to make a DDR SDRAM useful for a variety of applications. The default value of the mode registers may not be defined. Therefore, the mode registers can be written after power up using the command pins for proper DDR SDRAM operation.

Two clock cycles are typically needed to complete a write operation to the mode registers. The contents of the mode registers can be changed using the same command and clock cycle requirements during operation, as long as all banks are in the idle state. The mode registers are divided into various fields depending on functionality. There are also modes that allow for programming of anti-fuses, test redundant elements, temporary analog voltages and ac timing adjustments, and so on.

Specific test modes can be accessed via test mode registers. The mode register command set is used to register MA[7:0] bits on the positive edge of a clock signal CK, and then register OP[7:0] bits on a negative edge of the clock signal CK. A specific mode register command can be used to enter the test mode register command set for writing to test mode registers. A mode address ("MA") space for TMRs[47:0] only become available after entering a test mode via the mode register command. Since the test modes have their own unique mode address space, the normal mode register write ("MRW") and mode register read ("MRR") modes are still available.

All mode register settings can be persistent until cleared. This allows for stacking of test modes. There can be essentially two levels of test registers. The first level of test registers are generated by MA[7:0]+OP[7]; i.e. TMR modes TMR[0:49]. The second level of test registers is programmed by a combination of TMR[49:0]+OP[7:0]. The second level programmed registers are only cleared by a reset command CMD_RST or a separate TMR[n] mode specifically to reset certain test modes. Exiting the test mode may not clear the secondary test registers. Once in the test mode, the MRW address is extended to start from MR128. Therefore, TMR[0] is MR[128], and TMR[1] is MR[129] and so on; i.e. TMR[x]=MR[x+128].

Figure 6:
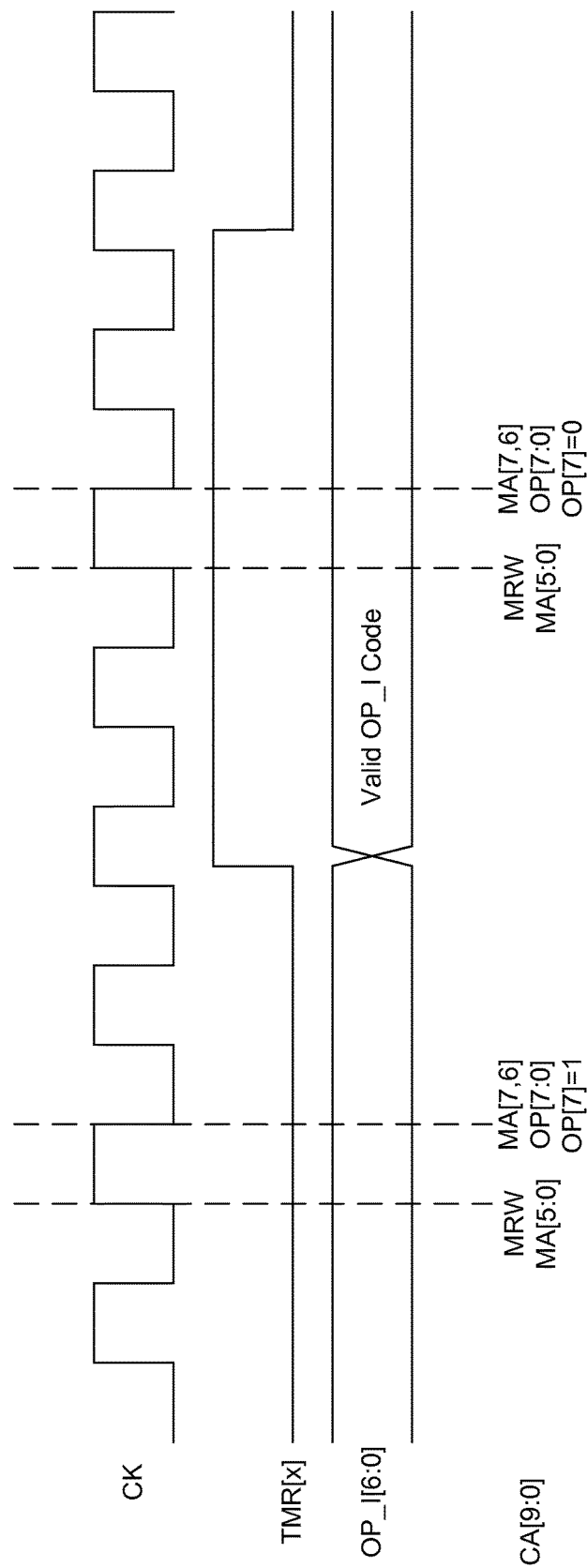
FIG. 6 illustrates a graph of clock signals and command signals of a memory device of the present disclosure.

FIG. 6 illustrates a timing graph in which a valid operational code is received after a MR write command is issued. The timing diagram illustrates first and second level test mode register settings. Note that a TMR[x] signal is persistent until the associated OP[7] bit is registered low. Toggling a TMR signal high and low is used to latch OP[6:0] bits to program the secondary test registers. The OP_I[6:0] are generated from OP[6:0]. There is also a restriction between issuing back to back MRW commands (not shown in the timing diagram). The number of clock cycles between MRW commands can be 10 clock cycles.

Figure 7:
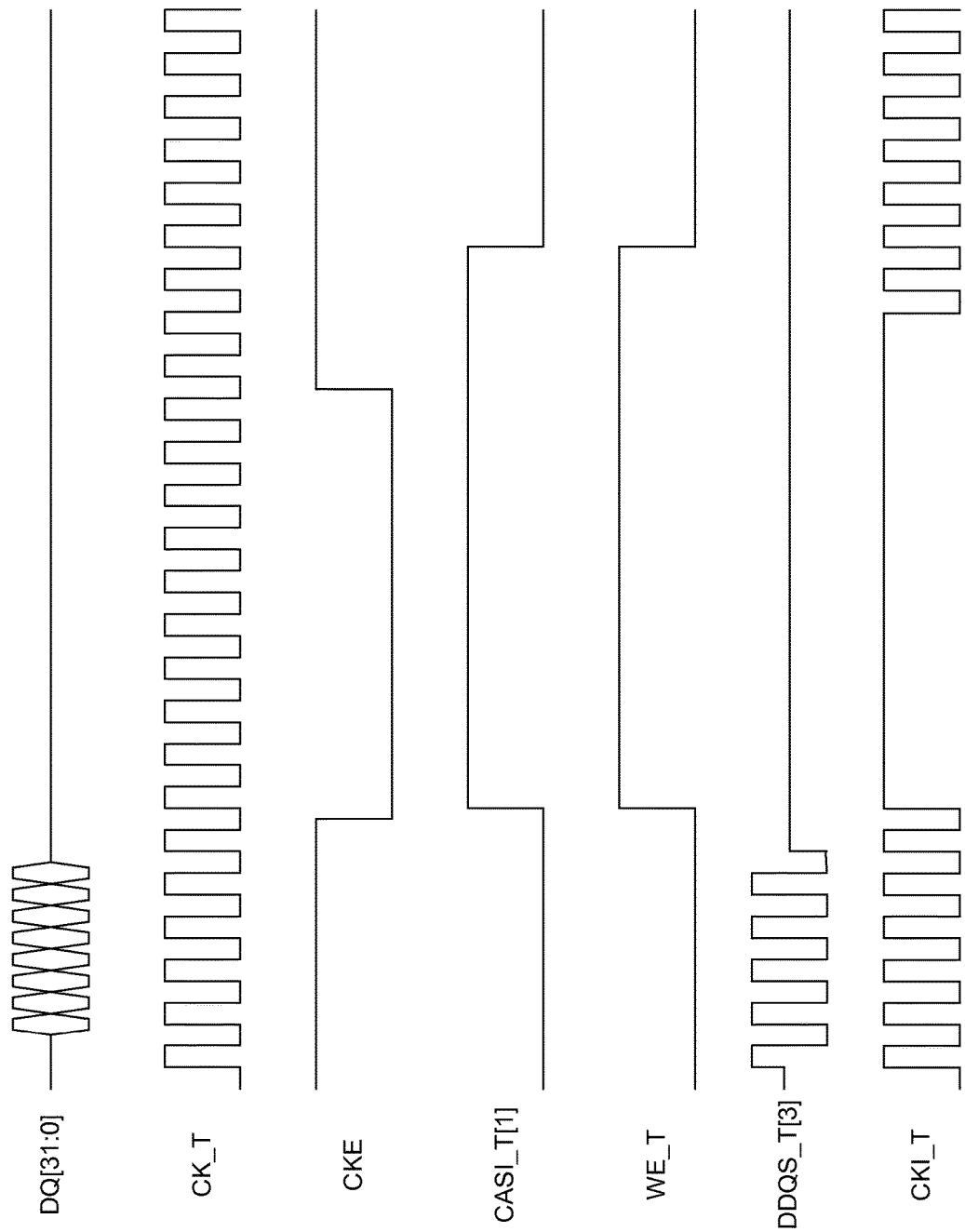
FIG. 7 illustrates a graph of clock and data signals of a memory device of the present disclosure.

FIG. 7 illustrates a timing graph in which a clock signal can be stopped using a MR command to allow time for the blowing of anti-fuses. The DQ[31:0] signal is the 32 bits that are read or written via the I/O block. The CK_T signal is a clock signal that can be used by the respective memory device. To program (i.e., blow) an anti-fuse, the test register TMR[0] and an assigned op-code can be used to enable fuse selection and programming modes. There can be four fuse areas, including row, column, fuse identifier ("ID"), and TMR fuses.

A row fuse can be selected by issuing an activate command along with the assigned row address. A column fuse is selected by issuing a write command along with the assigned column address. The TMR[1] is used to latch the fuse-ID, anti-fuse address that is decoded by OP[6:0]; and the TMR [2] is used to latch the TMR anti-fuse address that is decoded by OP[6:0].

A common ground CGND can be used to program anti-fuses. CGND is normally set to a ground potential during normal operation. During programming, this CGND line can be brought to the programming voltage, e.g., a higher voltage than the power supply. In an embodiment of the present disclosure, an on-chip high voltage pump can be enabled to bring CGND to the programming voltage of about 6 v (or any other desired programming voltage) before a program pulse is generated. The fuse to be blown can be uniquely selected using the fuse address enable and decoding mode.

The program pulse is generated by issuing a write command. The internal column address select (and write pulse) is extended by stopping an internal clock signal CKI (hold CK LOW) 2 clocks after WL+BL/2, or by issuing a clock stop command—by bringing a clock enabled signal CKE low one clock after WL+BL/2, where WL is the write latency and BL is the burst length. The WL depends on the operating frequency. Also, the BL can be programmed depending on the memory configuration mode. For instance, the BL can be 8 clock cycles for the LPDDR3 memory configuration mode or be programmed to be 4, 8, or 16 clock cycles for LPDDR2. In the case of column fuse programming, the write command selects and programs the column fuses at the same time. A read command is issued to read the programmed fuse status through one or more DQ blocks. When the CKE signal goes high, the stop clock mode is exited and the internal clock signal CKI can resume. The internal write enabled ("WE") and CAS signals can be extended when the CKE signal goes low, which allows the fuse programming period to be controlled for a predefined amount of time and/or clock cycles.

The TMR[3] and [4] test modes can allow for row and column redundancy pre-test. The TMR[5] test mode can disable any redundant row or column that has been programmed. The TMR[6] test mode can disable the programmed TMR registers returning it to its original pre-programmed state.

In an embodiment of a memory device of the present disclose, there can be four rows of fuse bank instances in each 8 Mb sub-array segment, FRB0, FRB1, FRB2, and FRB3. Each one is uniquely addressed by RA1 and RA2. Row addresses RA<12:9> are used to address the 16 sub-array segments. The sub-array 0 to 15 can have the same pre-test address at sub-array 16 to 31. The edge sub-array, sub-ary0_B and sub-ary0_T are equivalent to one sub-array; the same row in both sub-ary0_B and sub-ary0_T will turn on at the same time.

Figure 8:
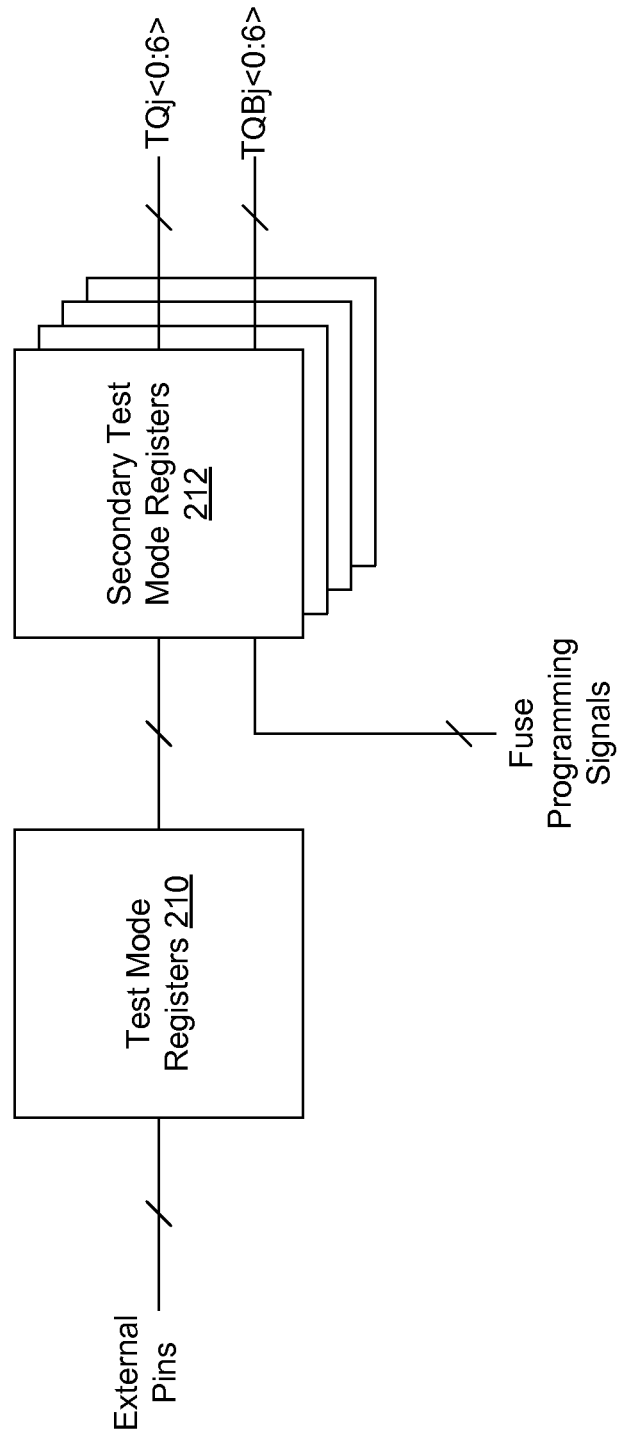
FIG. 8 illustrates a block diagram for programming test registers of a memory device of the present disclosure.

FIG. 8 illustrates a block diagram for programming test registers of a memory device of the present disclosure. A test mode can be entered using a mode register command inputted through external pins of the memory device and stored in the mode registers. Once in a test mode, the primary test mode registers will be available, i.e., all TMR registers are available for writing. TMR "k" can have an out signal, TMR<k>. The total TMR signals can be from TMR<0:k>.

In an embodiment, there can be 48 TMRs; thus, TMR<0: 47>, where k=47. Note that with MA<0:7> and OP<0:7>, a maximum 65,536 signals are possible. The MR command in test mode generates TMR<0:k> and OP_I<0:7>. When OP_I<7> is in a high state, it will bring TMR<j> active and also to a high state. When OP_I<7> is in a low state, it will bring TMR<j> active and also in a low state. The OP_I<0:6> test option bus is used to write to secondary TMR, whose outputs are TQj and TQBj, where TQ is true data, and TQB is the complement data. In most cases, only the true data bit, TQ, is used. Physically, there can be k+1 TMR lines, and 8 OP_I lines. Additional one or more anti-fuses can be used to cancel any anti-fuse or a group of anti-fuses that have been previously programmed. A product feature, configuration, redundant elements, and/or on-chip DC and AC parameters that were previously programmed can also be cancelled or disabled, and a new set of features, configuration, redundant elements, and/or parameters can be reprogrammed. A cancel anti-fuse bit or set of bits can be blown to generate any cancel or disable signals.

The test mode registers 210 and secondary test mode registers 212 can be used to change the memory device configuration and options back and forth, on-the-fly, or make changes permanently; adjust internal timing and analog voltages on-the-fly or make changes permanently; adjust self-fresh timing and on-chip temperature sensor on-the-fly or changes permanently; perform efficient stress tests and wafer level burn-in; perform redundant element pre-tests; program fuse ID and read out from designated DQ pins; program redundant elements for memory repair at wafer and packaged level; monitor critical internal signals using designated DQ pins; generate on-chip data pattern and data test compression; and provide other useful programming options for the memory device.

Figure 9:
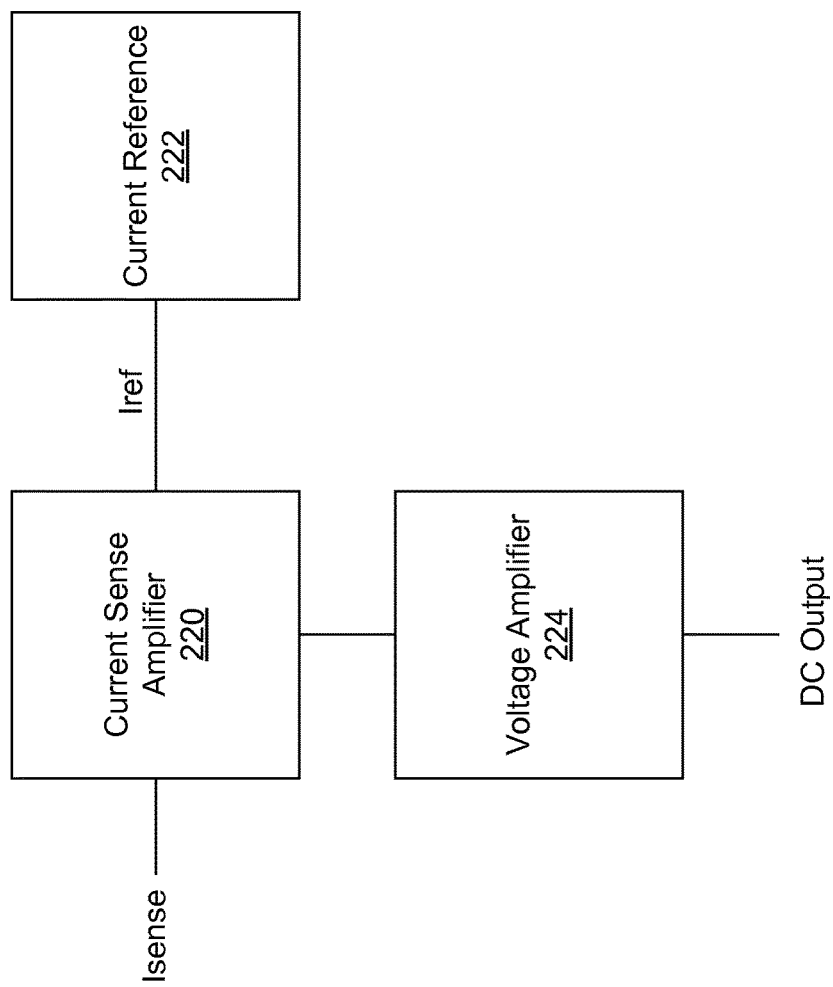
FIG. 9 illustrates a block diagram for determining whether an anti-fuse is blown.

FIG. 9 illustrates a block diagram for determining whether an anti-fuse is blown. In order to determine whether an anti-fuse was properly blown, a current is driven through an anti-fuse under test "AUT"), a current sense amplifier 220 senses a current Isense through the AUT. If the Isense is very large (or near infinite), the AUT has properly blown the anti-fuse under test. If the Isense is very low (or zero), the AUT was not properly blown. However, to speed up the detection of such cases, a current reference 222 is supplied to the current sense amplifier 220 to compare with the Isense. The difference of Isense and Iref are inputted to a voltage amplifier 224 to provide a digital output. The voltage amplifier 224 can provide a high voltage state or a low voltage state to an external pad of the memory device to confirm whether the AUT was properly blown or not. For instance, a logic low output at the external pad could mean the anti-fuse was properly blown, and a logic high output at the external pad could mean the anti-fuse was not properly blown.

Figure 10:
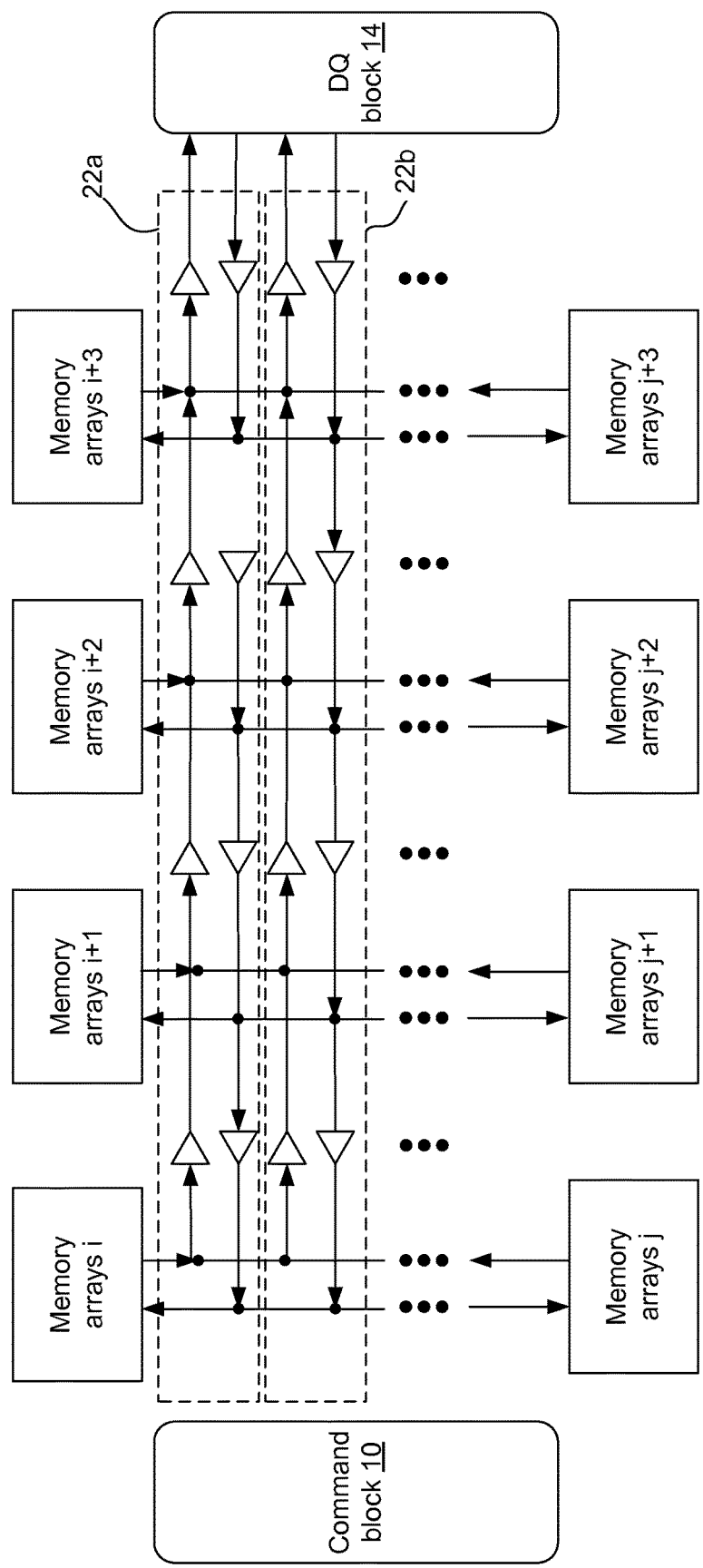
FIG. 10 illustrates a block diagram of a memory device of the present disclosure having unidirectional data lines.

FIG. 10 illustrates a block diagram of a memory device of the present disclosure having unidirectional data lines. The present disclosure can be expanded to have a predefined number of storage banks, where each of those storage banks can be further partitioned into another predefined number of sub-banks. Each of the sub-banks can be implemented by memory arrays i through memory arrays i+m and memory arrays j through memory arrays j+n. For instance, the first one-half sub-bank of the storage bank 0 can be implemented by memory array i, the first one-half sub-bank of the storage bank 4 can be implemented by memory arrays j, the first one-half sub-bank of the storage bank 1 can be implemented by memory arrays i+1, the first one-half sub-bank of the storage bank 5 can be implemented by memory arrays j+1, and so on and so forth.

To aid in the understanding of the present disclosure, a zoomed in view of the upper half of the memory device having the first one-half sub-banks of the storage bank 0-7 and the DRW channel 22 are depicted. A person having ordinary skill in the art can apply this implementation to the bottom half of the memory device and, even more generally, to any number of sub-banks and DRW channels in accordance with the present disclosure.

The memory arrays i are used to implement the first one-half sub-bank of the storage bank 0; the memory arrays i+1 are used to implement the first one-half sub-bank of the storage bank 1; the memory arrays i+2 are used to implement the first one-half sub-bank of the storage bank 2; the memory arrays i+3 are used to implement the first one-half sub-bank of the storage bank 3; the memory arrays j are used to implement the first one-half sub-bank of the storage bank 4; the memory arrays j+1 are used to implement the first one-half sub-bank of the storage bank 5; the memory arrays j+2 are used to implement the first one-half sub-bank of the storage bank 6; and the memory arrays j+3 are used to implement the first one-half sub-bank of the storage bank 7. If a design has more than 8 sub-banks, then additional memory arrays (not shown) can be added to account for those additional sub-banks including memory arrays i+m and memory arrays j+n, where m and n are integers.

The DRW channel 22 can be implemented by 16 bit-lines for transferring 16 bits to its associated DQ blocks 28 and 30 of the DQ block 14. For instance, a bit-line 22a comprises two unidirectional buffer lines for reading and writing a data bit k to the first one-half sub-banks of the storage banks 0-7. A bit-line 22b comprises two unidirectional buffer lines for reading and writing a data bit k+1 to the first one-half sub-banks of the storage banks 0-7. There can be 16 bit-lines in total for this particular design. However, it is understood that any number of bit-lines can be used depending on the number of bits that need to be transferred between the sub-banks and the DQ blocks.

The serially-connected unidirectional buffers 22a and 22b can be used to read a data bit from the sub-banks or write data to the sub-banks. For each operation, a single buffer line of the serially-connected unidirectional buffers 22a and 22b can be dedicated for reading data from the memory arrays or for writing data to the memory arrays. Therefore, the serially-connected unidirectional buffers of the present disclosure may have two distinct buffer lines within each bit-line.

Additionally, unidirectional buffers can be added to the data read/write channels to cover any number of bits to be written to the sub-banks or read from the sub-banks A person having ordinary skill in the art can appreciate that the present disclosure can be adapted to include such variations as to the number of sub-banks and buffers.

Figure 11:
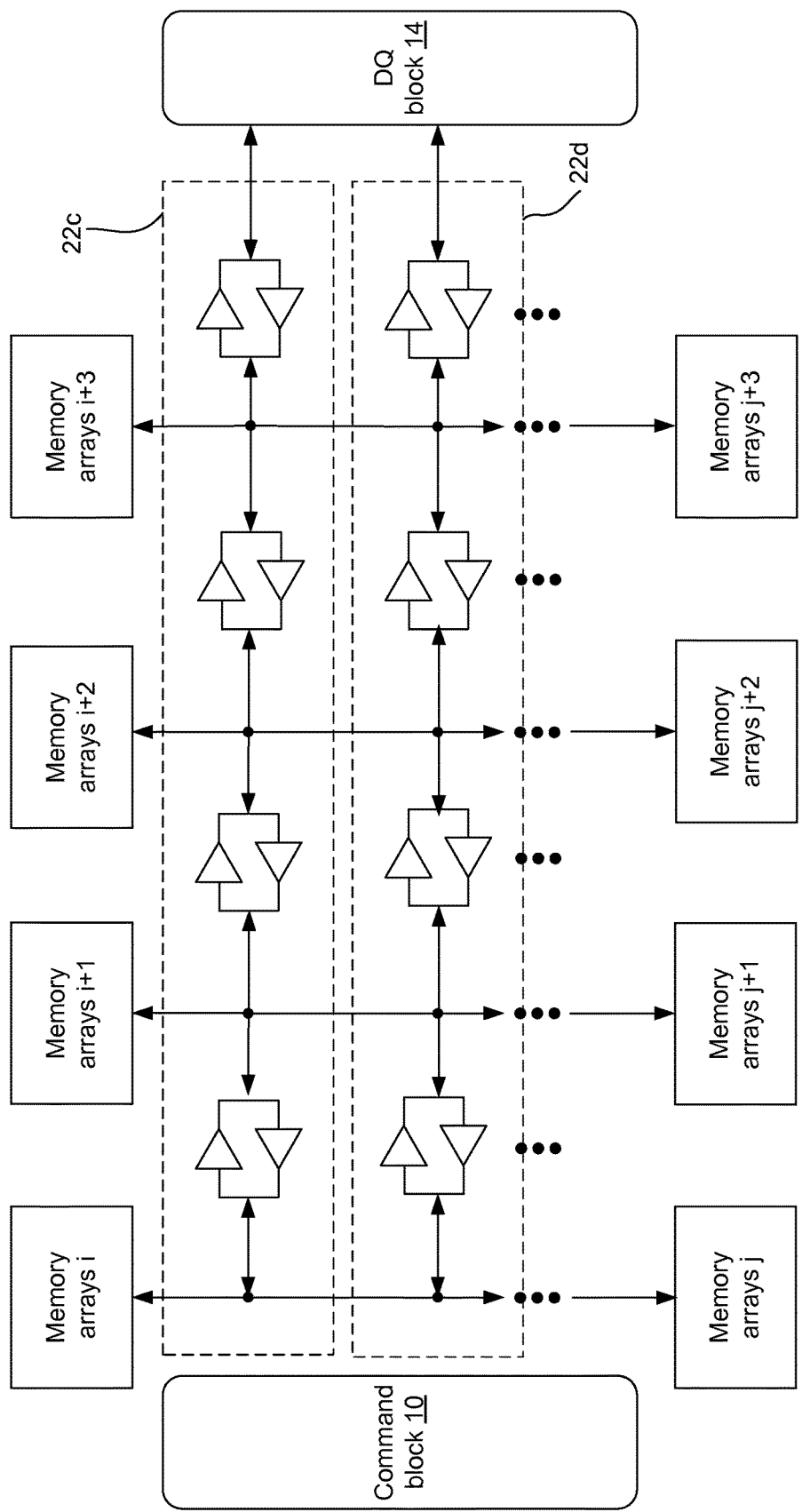
FIG. 11 illustrates a block diagram of a memory device of the present disclosure having bidirectional data lines.

FIG. 11 illustrates a block diagram of a memory device of the present disclosure having bidirectional data lines. In another embodiment, the DRW channel between two rows of the memory core can be implemented by a plurality of serially-connected bidirectional buffers, e.g., bidirectional buffers 22c and 22d. The serially-connected bidirectional buffers can be used to read a data bit from the sub-banks or write a data to the sub-banks. For instance, the serially-connected bidirectional buffer 22c can be implemented by a buffer line from each of the memory arrays i through memory arrays i+m and memory arrays j through memory arrays j+n for transferring a kth bit from the sub-banks to the DQ block 14. The serially-connected bidirectional buffer 22d can be implemented by a bit-line from each of the memory arrays i through memory arrays i+m and memory arrays j through memory arrays j+n for transfer a kth+1 bit from the sub-banks to the DQ block 14.

Additionally, another buffer line for the serially-connected bidirectional buffer 22c can be implemented by a buffer line from the DQ block 14 to each of the memory arrays i through memory arrays i+m and memory arrays j through memory arrays j+n for transferring a kth+z bit from the DQ block 14 to the sub-banks In the instant example, there can be sixteen bidirectional buffer lines to handle the two bytes that are transferred via the DRW channel 22. A person having ordinary skill in the art can appreciate that the present disclosure can be adapted to include such variations as to the number of sub-banks, DRW channels, and buffers.

Figure 12:
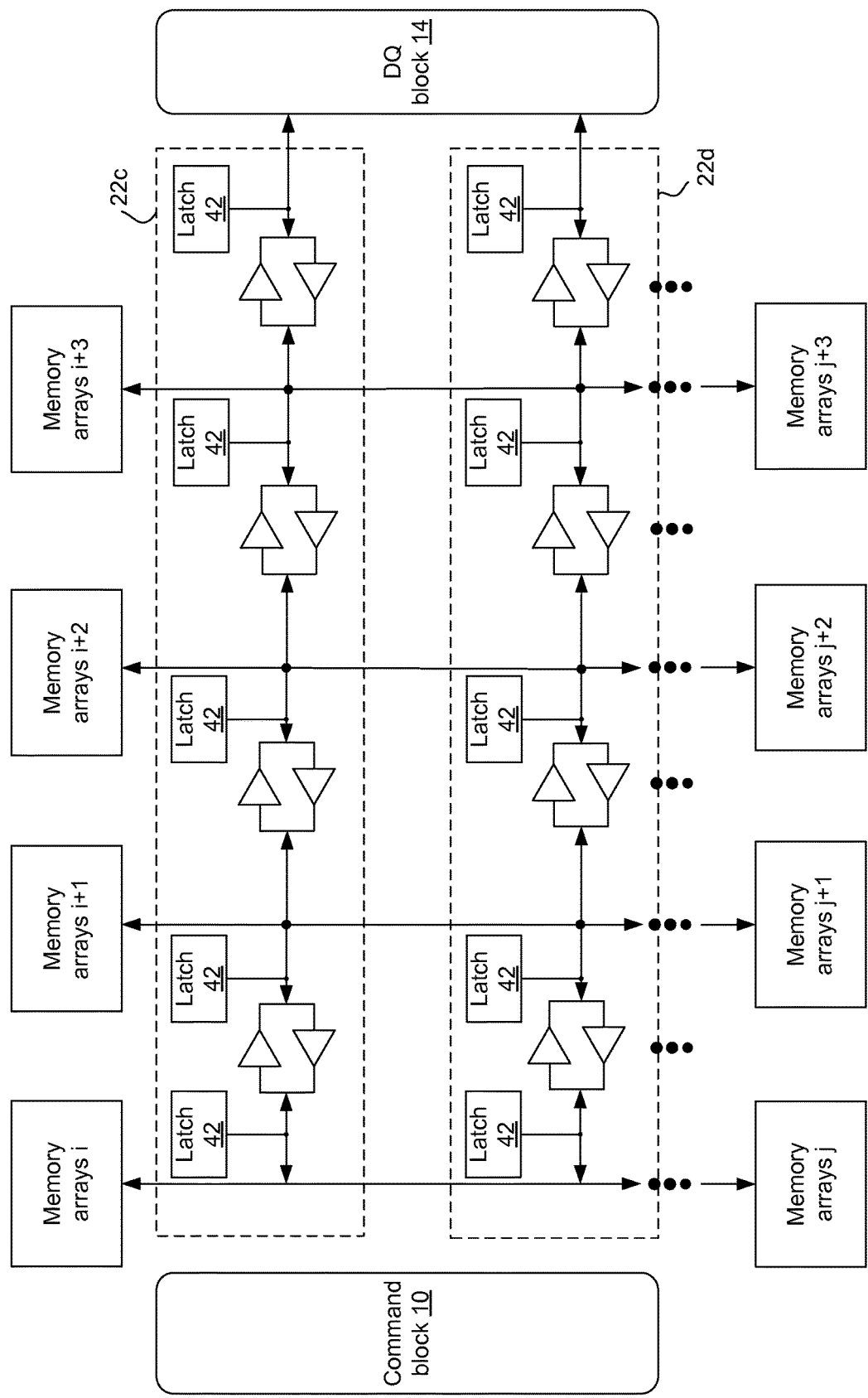
FIG. 12 illustrates a block diagram of a memory device of the present disclosure having bidirectional data lines with latches.

FIG. 12 illustrates a block diagram of a memory device of the present disclosure having bidirectional data lines with latches. In some embodiments, the serially-connected bidirectional buffers 22c and 22d can further comprise latches 42. Each of the latches 42 is connected along the transmission line between two bidirectional buffers (or unidirectional buffers in other embodiments) of the serially-connected bidirectional buffers 22c and 22d. The latches 42 can keep the transmission lines from floating by setting the respective line to a high or low voltage value. The latches 42 can be controlled by power up ("pwrup#") signals for setting the transmission lines.

FIGS. 13a-13d illustrate block diagrams of latches of the present disclosure. A latch cam be implemented by various circuits. Examples of such circuits are illustrated to aid in the understanding of the invention. It is however understood that a variety of latches can be used to maintain the voltage characteristics of the buffer line from varying from a desired voltage value.

Referring to FIG. 13a, a latch comprises inverters 50 and 52, and an NMOS 54. A pwrup# signal is applied to the gate of the NMOS 54. The drain of the NMOS 54 is connected to the input of the inverter 50 and the output of the inverter 52 to generate an RW_Data signal that is applied to the data transmission line of the respective DRW channel. The output of the inverter 50 is inputted to the input of the inverter 52.

Referring to FIG. 13b, a latch comprises inverters 56 and 58, and a PMOS 60. A pwrup# signal is applied to the gate of the PMOS 60. The source of the PMOS 60 is connected to the input of the inverter 56 and the output of the inverter 58 to generate the RW_Data signal that is applied to the data transmission line of the respective DRW channel. The output of the inverter 56 is inputted to the input of the inverter 58.

Referring to FIG. 13c, a latch comprises an inverter 62 and a NAND gate 64. A pwrup# signal is inputted to the NAND gate 64. The output of the inverter 62 is inputted to another input of the NAND gate 64. The input of the inverter 62 and the output of the NAND gate 64 are connected together to generate the RW_Data signal that is applied to the data transmission line of the respective DRW channel.

Referring to FIG. 13d, a latch comprises an inverter 66 and a NOR gate 68. A pwrup# signal is inputted to the NOR gate 68. The output of the inverter 66 is inputted to another input of the NOR gate 68. The input of the inverter 66 and the output of the NOR gate 68 are connected together to generate the RW_Data signal that is applied to the data transmission line of the respective DRW channel.

Figure 14:
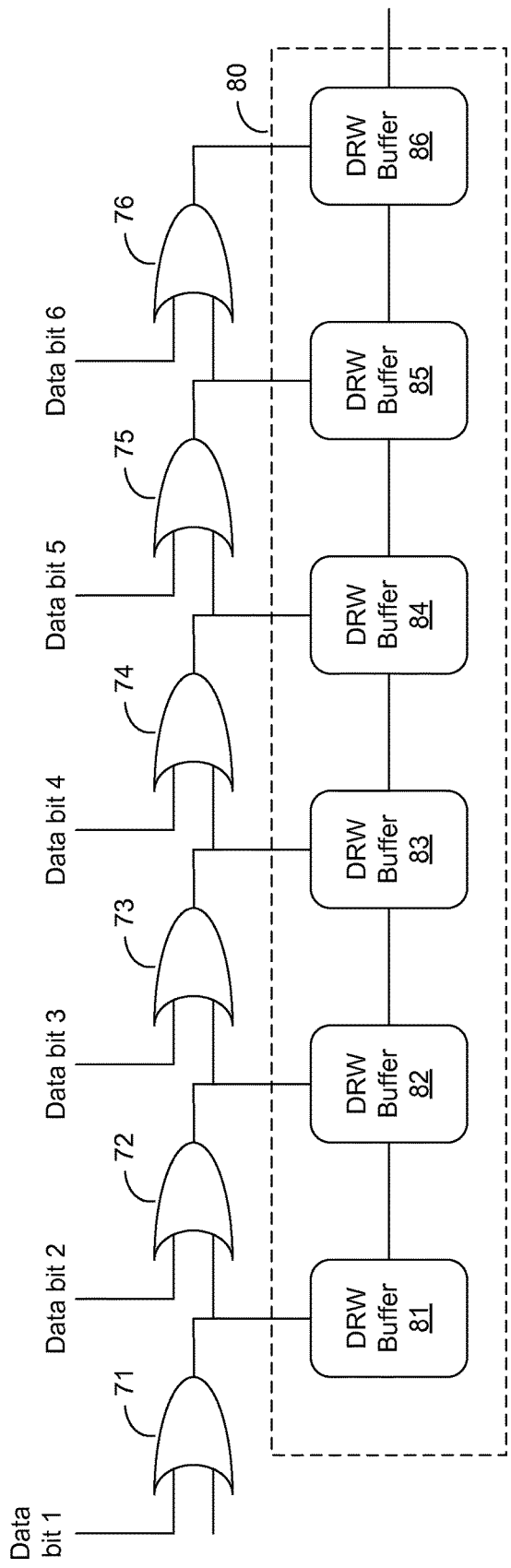
FIG. 14 illustrates a buffer activation circuit of a memory device of the present disclosure.

FIG. 14 illustrates a buffer activation circuit of a memory device of the present disclosure. A buffer activation circuit comprises serially-connected OR gates 71-76 and buffers 81-86 of a DRW channel 80. Each of the outputs of the OR gates 71-76 are connected to one of the buffers 81-86 to activate or disable the respective buffers 81-86. Based on the serial connection of the OR gates 71-76, if one of the data bits 1-6 are high, then the respective OR gate that receives that high signal as input will output a high signal to the buffer it's connected to. The outputted high signal travels down the line of serially-connected OR gates, turning on the buffers along that line as well. Consequently, the respective buffers of the activated OR gates will be enabled and drive the high data bit from one activated buffer to the next activated buffer.

For instance, assuming the data bits 1, 2, 3, 5, and 6 are low and the data bit 4 is high, then the OR gate 74 will output a high signal since its input is the high data bit 4. The OR gate 74 will output a high signal to the buffer 84 and OR gate 75. The high signal will travel down the chain of OR gates, including OR gate 76, and activate the buffer 85 and 86. The other OR gates 81-83 and the buffers 71-73 are not active since the data bits 1, 2, and 3 are low.

A person having ordinary skill in the art can increase or decrease the number of OR gates and DRW buffers to use in the buffer activation circuit and the DRW channel depending on the design and requirements of the respective memory device. In addition, other equivalent circuits can be used to implement the buffer activation methodology of the present disclosure.

A memory device that has transistors, e.g., complementary metal-oxide-semiconductor ("CMOS") transistor technology, can suffer from latching up. CMOS integrated circuits have n-channel metal-oxide-semiconductor ("NMOS") transistors and p-channel metal-oxide-semiconductor ("PMOS") transistors. NMOS and PMOS integrated circuits have four terminals, including a drain, a source, a gate, and a body. The body terminal, which is sometimes referred to as the well or bulk terminal, can be biased. For example, a positive bias voltage can be applied to the n-type body of a PMOS transistor and a negative bias voltage can be applied to the p-type body of an NMOS transistor. These bias voltages increase the threshold voltages of the transistors and thereby reduce their leakage currents. Reductions in leakage current reduce power consumption.

In commonly-used CMOS integrated circuit transistor structures, doped semiconductor regions form a pair of parasitic bipolar transistors. The presence of the parasitic bipolar transistors makes the CMOS transistors susceptible to an undesirable phenomenon called latch up. During a latch up event, feedback paths are created in the parasitic bipolar transistors that cause the CMOS transistors to function improperly. In severe situations, latch up can permanently damage the CMOS transistors and the respective device. Latch up problems are particularly serious in integrated circuits using body biasing.

One way to prevent latch up in a CMOS integrated circuit is to place power-up restrictions on users of the integrated circuit. These power-up restrictions dictate the order in which various voltage supply pins on the integrated circuit can receive signals. By designing systems to strictly follow the power-up rules, designers can be assured that the integrated circuit will not exhibit latch-up.

A latch-up prevention system of the present disclosure is discussed in relation to PMOS transistors of a memory device (e.g., a DRAM). However, it is understood by a person having ordinary skill in the art that latching up can occur in other transistors (e.g., NMOS transistors) and in other applications. Therefore, it is the intention that the latch-up prevention system of the present disclosure is applicable to other types of transistors and in other types of applications.

In reference to the figures, external voltages XVdd1 and XVdd2 can be the global power applied to pads of the memory device. For a low power memory device, a power gating structure is needed to isolate the power gating to control the external voltages and currents to the memory device. A p-type metal-oxide-semiconductor transistor can be used to control the conversion of the external voltages XVdd1 and XVdd2 to acceptable internal voltages Vdd1 and Vdd2. Once converted, the internal voltages Vdd1 and Vdd2 can be distributed throughout the memory device.

During power up, a deep power down ("DPD") signal is low until there is a deep power down when the DPD signal transitions high. The DPD signal can be used to enable the various power gates and power up circuitry of the memory device. Power gate circuits (not shown, but generally known in the art for voltage conversions) can convert the XVdd1 to an acceptable Vdd1 to meet the internal voltage requirements of a particular memory device. Likewise, the power gates can convert the XVdd2 to an acceptable Vdd2.

For DRAM devices (and other memory devices), sense amplifiers and other semiconductor devices are necessary for memory core operations. The sense amplifiers include PMOS transistors in their implementations. The PMOS transistors of these sense amplifier and other circuits and elements of the memory device may suffer latch up when the voltage at the nwell of the PMOS transistors is less the drain voltage of the PMOS transistors.

In order to prevent latch up, a voltage Vccp is applied to the nwell of the PMOS transistors and a voltage Vcca is applied to the drain of the PMOS transistors. If the Vcca is greater than Vccp at any time during power up, current flow from the drain of the PMOS transistors may flow to the nwell of the respective PMOS transistors. In such case, the PMOS devices may latch up, and cause irreparable damage to the respective memory device. Therefore, a power up scheme for the memory device must drive the voltage Vccp earlier and faster than the voltage Vcca. In addition, the power up scheme must keep the Vccp level greater than or equal to the Vcca level at all times during power up.

Figure 15:
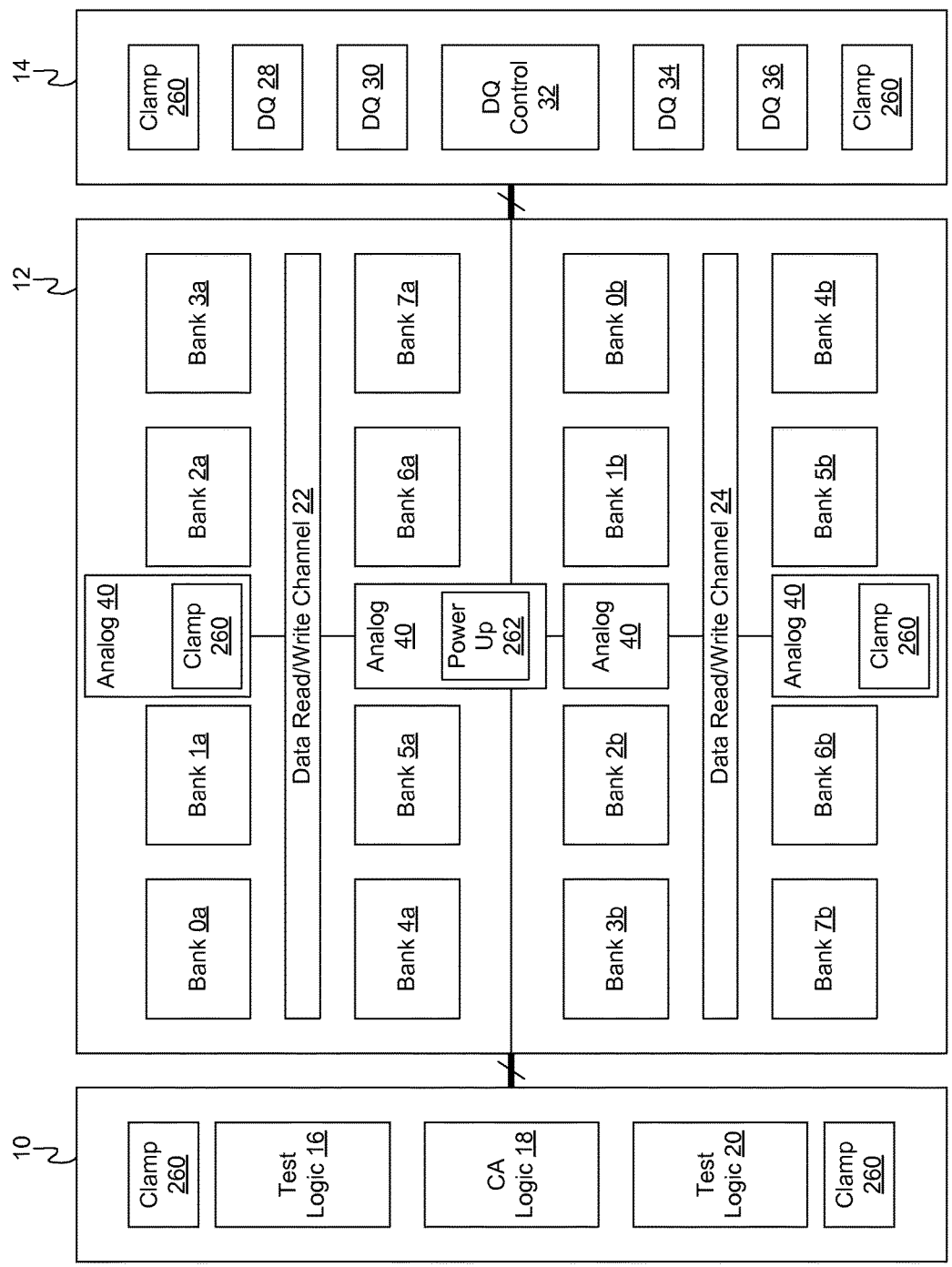
FIG. 15 illustrates a block diagram of a memory device of the present disclosure having a power up circuit and clamping circuits.

FIG. 15 illustrates a block diagram of a memory device of the present disclosure having a power up circuit. The memory device comprises the command block 10, the memory core 12, the DRW channels 22 and 24, and the DQ block 14. The internal power voltages Vdd1 and Vdd2 are distributed through the data read/write channels 22 and 24, analog blocks 40 of the memory core 12, the command block 10, and the DQ block 14.

A latch-up prevention system for PMOS transistors can be integrated into the memory device or be independent form the memory device. The latch-up prevention system can comprise a power up circuit, a Vccp power up driver, and a Vcca power up driver. The power up circuit generates a plurality of power up signals for use in the memory device. The Vccp power up driver drives the Vccp voltage signal to the wells of the transistors as a function of one or more of the power up signals. The Vcca power up driver drives the Vcca voltage signal to the drains of the transistors as a function of one or more of the power up signals. The Vccp voltage signal is equal to or greater than the Vcca voltage signal at all times (including during power up, standby, active use, power down, etc. of the respective memory device) to prevent latch up.

In an embodiment, the latch up prevention system can be integrated in the memory device. In such integration, the memory device further comprises clamp circuits 260 and a power up circuit 262 for powering up the memory device. The clamp circuits 260 can be located at the outer areas of the memory device. The purpose of the clamp circuits 260 can be to clamp (or precharge) Vccp to Vdd2 and Vcca to less than Vccp during power up of the respective memory device. Since Vccp's and Vcca's respective power lines are distributed throughout the memory device, the clamp circuits 260 can be placed at corners and edges of the respective memory device to strengthen the clamping (i.e., precharging) to ensure that Vccp and Vcca are precharged evenly at all points in the memory device. Vccp power up drivers and Vcca power up drivers (not shown) can be located near the clamp circuits 260.

The power up circuit 262 can be located within the analog blocks 40 (typically, near the center of the memory device). The power up circuit 262 uses the internal voltages Vdd1 and Vdd2. During power up, a low to a high signal will be generated to turn on some circuits and elements of the memory device. For instance, when the internal power reaches a defined state, the latches of the DRW channels 22 and 24 and other components of the memory device can be powered up accordingly.

The power up circuit block is controlled by the internal voltages Vdd1 and Vdd2, where Vdd1 is greater than Vdd2. As stated before, the internal voltages vdd1 and vdd2 are generated using power gating by external power supplies XVdd1 and XVdd2. During power up, both XVdd1 and XVdd2 are ramped up. After some threshold voltage in the power gating, the internal voltage Vdd1 follows XVdd1 and Vdd2 follows XVdd2.

After vdd1 and vdd2 achieve a certain voltage level during ramp up, a group of power up signals Pwrup1, Pwrup2, and Pwrup3 are generated. These power up signals are used mainly for memory device initialization (i.e., initializing latches to a defined state or initializing certain signals to a defined state as required by the design or specification requirements of the memory device for the memory device). The power up signals travel throughout the memory device (i.e., full chip), including the data read/write channels, data read and write latches, any center channels, command and test logics, etc.

Figure 16:
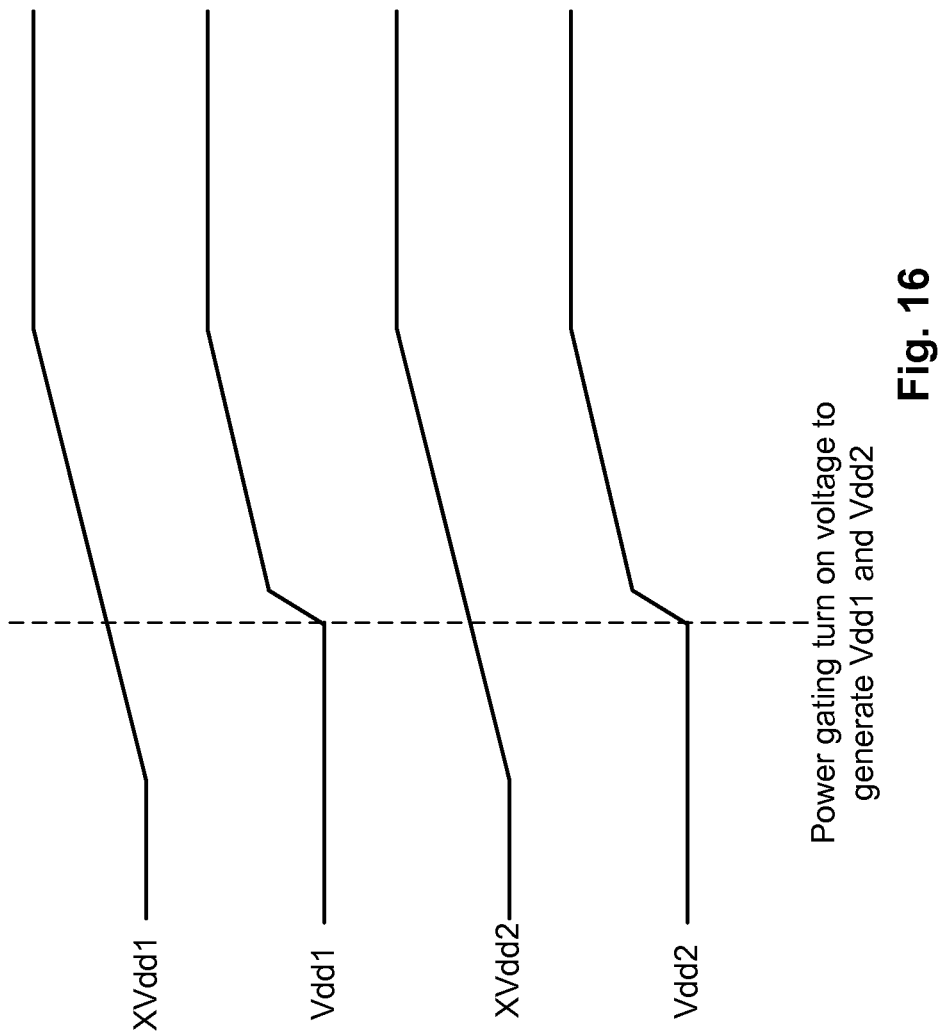
FIG. 16 illustrates a graph of external and internal voltages of a memory device of the present disclosure.

FIG. 16 illustrates a graph of external and internal voltages of a memory device of the present disclosure. When XVdd1 is ramping up from a low level, then a power gating device for converting XVdd1 to Vdd1 is off until a threshold voltage value for that power gating device is reached, in which the Vdd1 starts to follow the XVdd1. Likewise, when XVdd2 is ramping up from a low level, then a power gating device for converting XVdd2 to Vdd2 is off until a threshold voltage value for that powering gating device is reached, in which Vdd2 starts to follow the XVdd2. The power gating devices are mainly implemented by PMOS transistors as known in the art, but other types of transistors can be used. Therefore, the threshold voltage values to turn on the power gating devices may vary depending on the types of transistors used.

Figure 17:
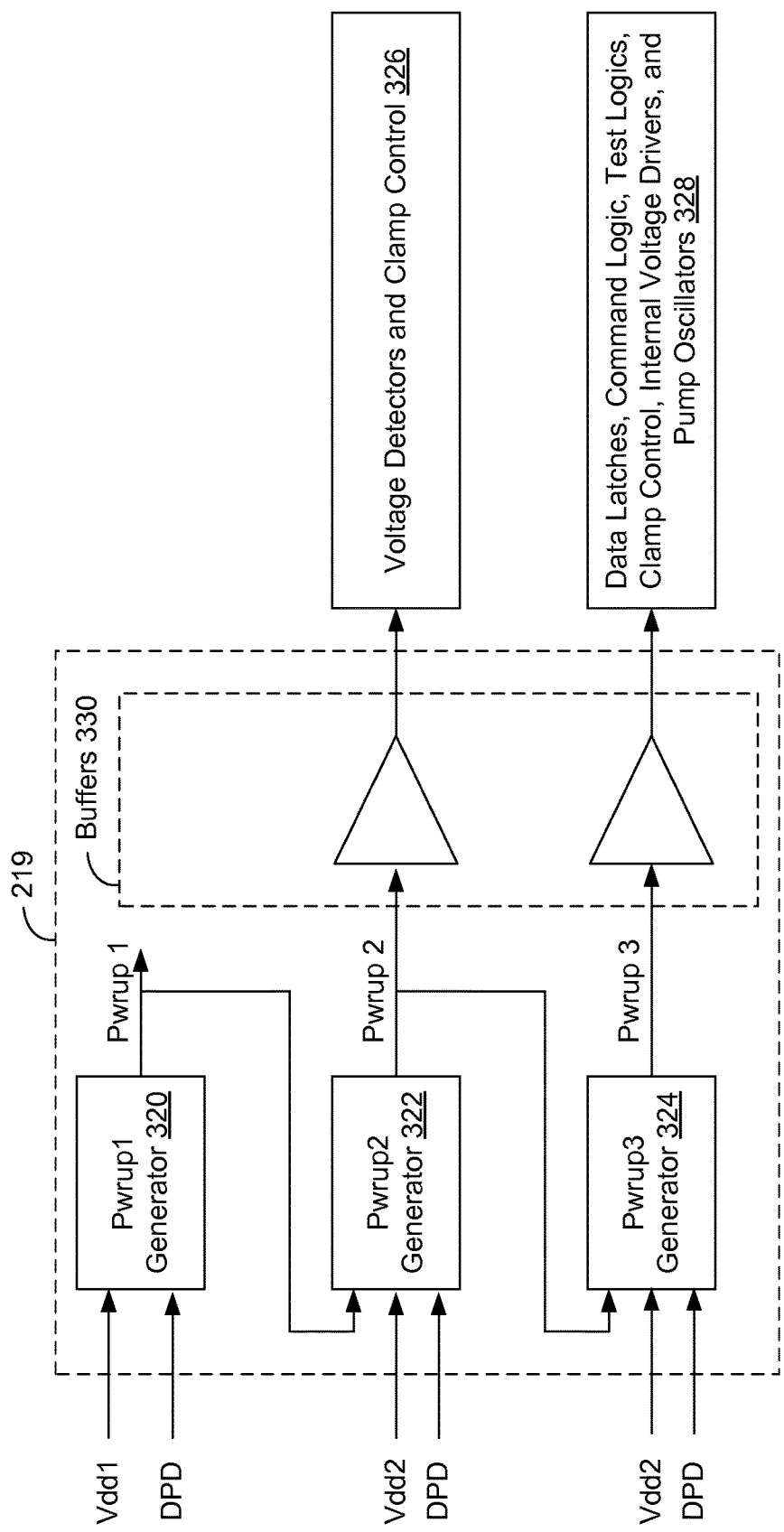
FIG. 17 illustrates a block diagram for a power up circuit of the present disclosure.

FIG. 17 illustrates a block diagram of a power up circuit of the present disclosure. The power up circuit 219 comprises a pwrup1 generator 320, a pwrup2 generator 322, a pwrup 3, generator 324, and buffers 330. The pwrup1 generator 320 receives the voltage Vdd1 and DPD signal as input, and generates the Pwrup1 signal. The DPD signal is low during the power up operation of the memory device. It can be used as an enable and disable signal for the generators 320-324. The pwrup2 generator 322 receives the Pwrup1 signal, the voltage Vdd2 and the DPD signal as input, and generates the Pwrup2 signal as output. The pwrup3 generator 324 receives the Pwrup2 signal, the voltage Vdd2 and the DPD signal as input, and generates the Pwrup3 signal as output. The Pwrup1 signal can be applied to local voltage detectors, so it may not need to be inputted to the buffers 330. The Pwrup2 and Pwrup3 signals are inputted to the buffers 330 to drive various semiconductor elements and devices of the memory device as needed or desired. For instance, the Pwrup2 signal can be used to drive voltage detectors and clamp circuits 326 of the memory device. The Pwrup3 signal can be used to drive the data latches, command logic, test logics, clamp circuits, internal voltage drivers, and pump oscillators 328 of the memory device.

FIG. 18 illustrates a graph of external voltages, internal voltages, and powering up voltages for a memory device of the present disclosure. As stated earlier, the Pwrup 1 signal, Pwrup2 signal, and Pwrup3 signal start at a low voltage level and transition to a high voltage level during power up of the memory device when certain triggering events happen. The high voltage value of the Pwrup 1 signal is at the voltage Vdd1. The high voltage value for the Pwrup2 signal and for the Pwrup3 signal is at the voltage Vdd2. Thus, the Pwrup2 and Pwrup3 signals have about the same voltage value when high, but can differ as to timing for the transitions from low to high and vice versa.

As for the Pwrup 1 signal, the Pwrup 1 signal transitions from a low voltage level to a high voltage level when Vdd1 reaches a certain threshold value. The pwrup2 signal transitions from low to high after Pwrup 1 signal is high and the Vdd2 voltage has reached a certain threshold value. The Pwrup3 signal transitions from low to high when the Pwrup2 signal is high and the Vdd2 voltage has reached a certain threshold value. For instance, the time delay between the transitions to high voltage levels of the Pwrup2 signal and the Pwrup3 signal can be about one hundred microseconds. Depending on the design, the delay can be varied to specifically meet any necessary specifications of the memory device.

Figure 19A:
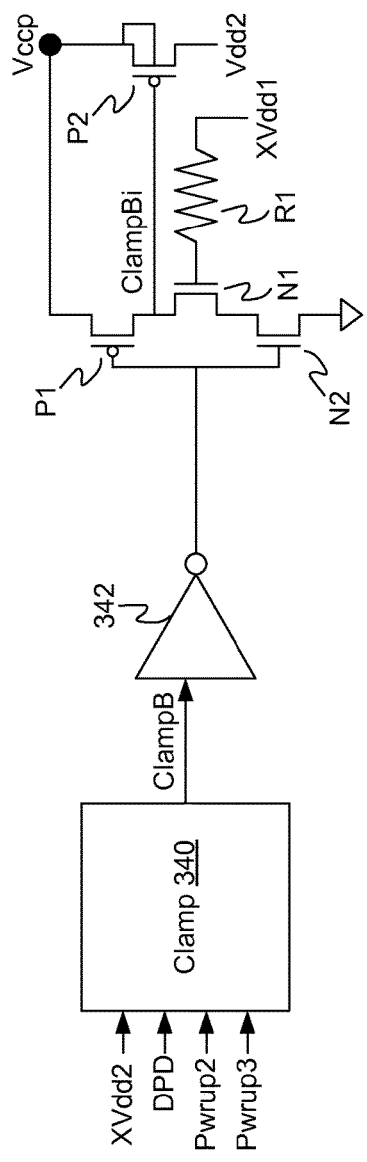
FIG. 19a illustrates a Vccp power up driver of the present disclosure for providing a power up phase of a memory device.

FIG. 19a illustrates a Vccp power up driver of the present disclosure for operating a power up phase of a memory device. The Vccp power up driver comprises a clamp circuit 340, an inverter 342, a PMOS P1, a PMOS P2, an NMOS N1, an NMOS N2, and a resistor R1. The clamp circuit 340 receives the following signals as input, XVdd2, DPD, Pwrup2 and Pwrup3 signals and generates a ClampB signal as output. The ClampB signal is inputted to the inverter 342. The inverter 342 can be powered by the external voltage XVdd2. The inverted ClampB signal is inputted to the gates of the PMOS P1 and NMOS N2. The PMOS P1, NMOS N1, and NMOS N2 are serially connected. The gate of the PMOS P2 is connected to the source of the PMOS P1. The drains of the PMOS P1 and P2 are connected to the Vccp signal. The source of the PMOS P2 is connected to the voltage Vdd2. The PMOS P2 drives Vccp from Vdd2 during power up. The PMOS P2 is a high voltage, low threshold PMOS device. The nwell of the PMOS P2 can be tied to the Vccp signal. The gate of the NMOS N1 is connected to the resistor R1, where the other end of the resistor R1 is connected to the external voltage XVdd1.

Figure 19B:
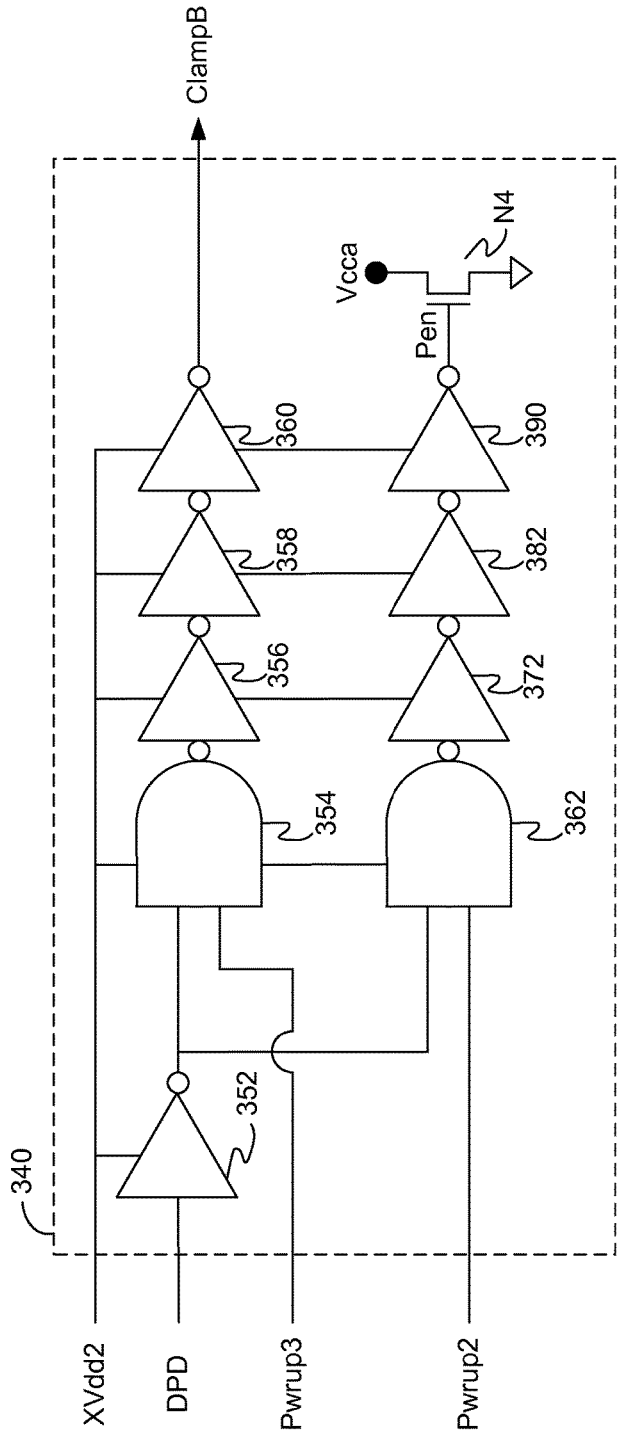
FIG. 19b illustrates a clamp circuit of the present disclosure.

FIG. 19b illustrates a clamp circuit of the present disclosure. The clamp circuit 340 can comprise inverters 352, 356-360, and 372-390, NAND gates 354 and 362, and an NMOS N4. The inverters 352, 356-360, and 372-390 and NAND gates 354 and 362 are powered by the external voltage XVdd2. The DPD signal is inputted to the inverter 352. The output of the inverter 352 is inputted to the NAND gates 354 and 362. The Pwrup3 signal is inputted to another input of the NAND gate 354. The Pwrup2 signal is inputted to another input of the NAND gate 362. The output of the NAND gate 354 is inputted to a string of the serially-connected inverters 356, 358, and 360. The output of the inverter 360 generates the ClampB signal. The output of the NAND gate 362 is also inputted to a string of the serially-connected inverters 372, 382, and 390. The output of the inverter 390 generates a Pen signal, which is applied to the gate of the NMOS N4. The Vcca signal is applied to the source of the NMOS N4, and the drain of the NMOS N4 is connected to ground. It is understood by a person having ordinary skill in the art that source and drain connections of a respective transistor of the present disclosure can be interchangeable depending on the arrangement of the respective circuit for the transistor and the transistor configuration.

Figure 20:
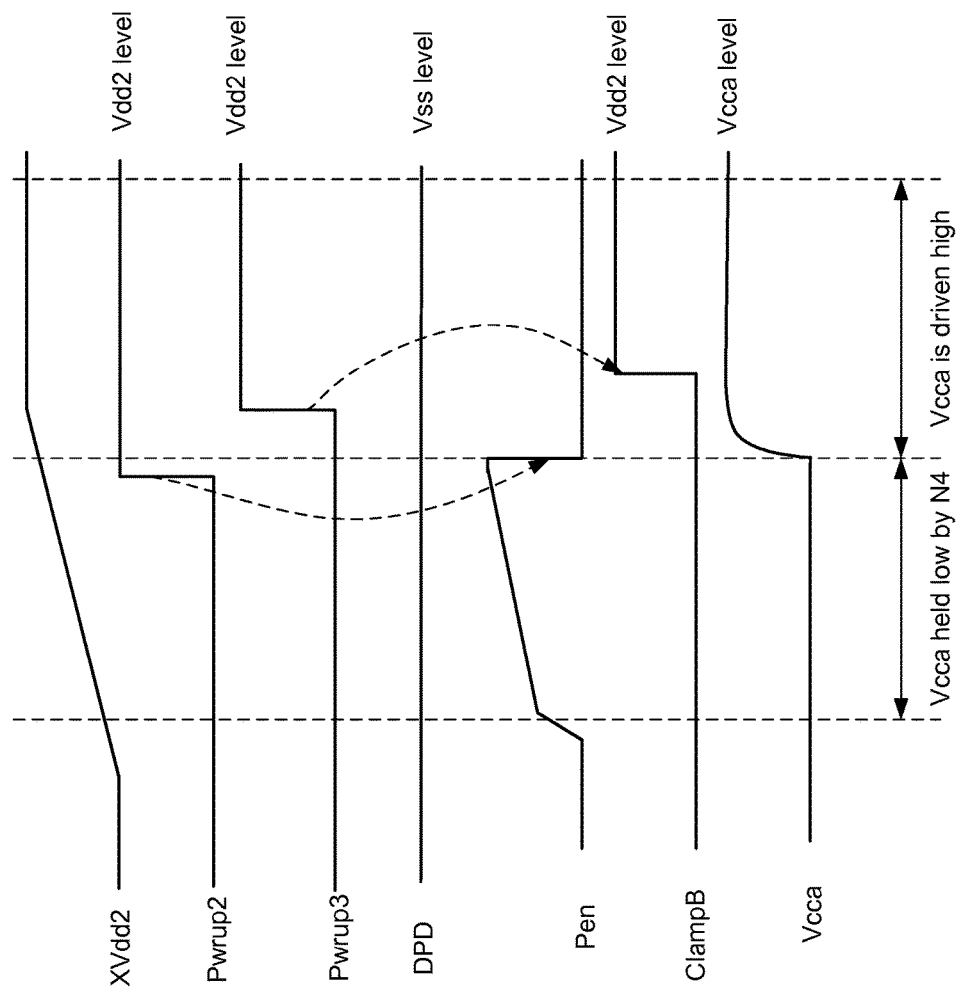
FIG. 20 illustrates a graph of external voltages and powering up voltages for a memory device of the present disclosure.

FIG. 20 illustrates a graph of external voltages and powering up voltages for a memory device of the present disclosure. Initially, the DPD signal, the Pwrup2 signal, and the Pwrup3 signal are low. During power up of the memory device, the external voltage XVdd2 ramps up. As the power up ramps up, a transistor of the inverter 390 will turn on once XVdd2 has reached a threshold value. The inverter 390 will then drive the Pen signal. Once the Pen signal reaches the threshold value for the NMOS N4, the NMOS N4 will turn on and drive the Vcca signal low. Once the Pwrup2 signal transitions high, it will trigger the Pen signal low. A low Pen signal will then turn off the NMOS N4, allowing the Vcca signal to be driven high. When the Pwrup 3 signal is low, then the ClampB signal is low. When the Pwrup3 signal transitions high, the ClampB signal will transition high.

Figure 21:
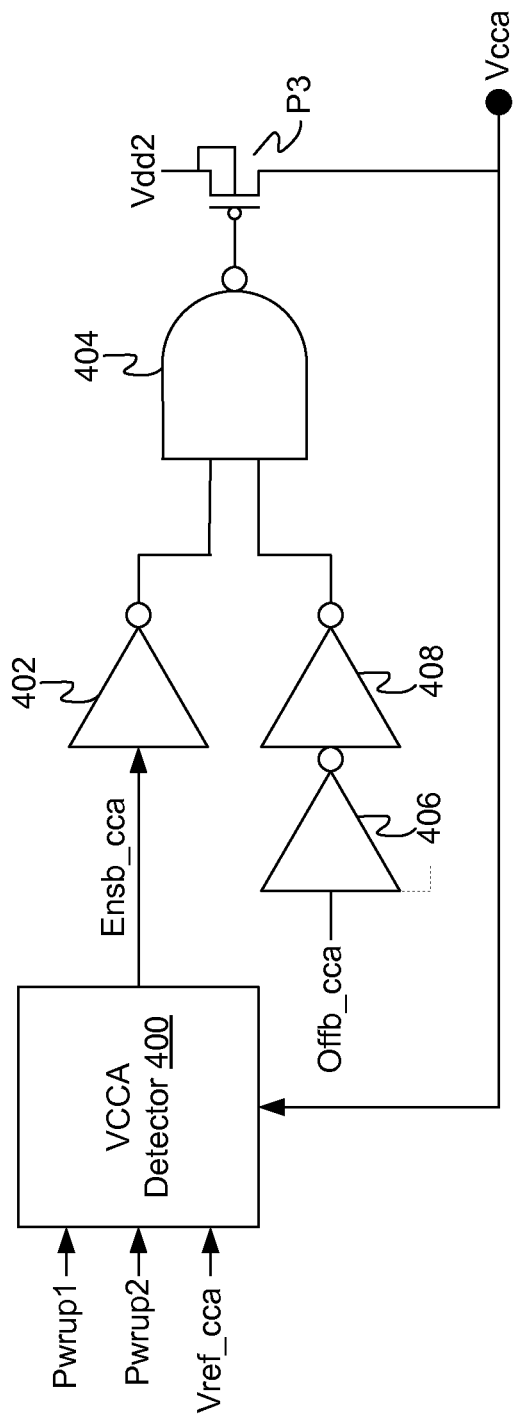
FIG. 21 illustrates a Vcca power up driver of the present disclosure for providing a power up phase.

FIG. 21 illustrates a Vcca power up driver of the present disclosure for providing a power up phase. The Vcca power up driver comprises a Vcca detector 400, inverters 402, 406, and 408, NAND gate 404, and a PMOS P3. The Vcca detector 400 receives the following inputs: Pwrup1 signal, Pwrup2 signal, a Vref_cca signal, and the Vcca signal. The Vcca detector 400 generates an Ensb_cca signal, which is inputted to the inverter 402. The output of the inverter 402 is inputted to the NAND gate 404. An Offb_cca signal is inputted to the serially-connected inverters 406 and 408. The output of the inverter 408 is inputted to another input of the NAND gate 404. The output of the NAND gate 404 is inputted to the gate of the PMOS P3. The voltage Vdd2 is applied to the drain of the PMOS P3. The source of the PMOS P3 drives the Vcca signal, which is fed back to the Vcca detector 400. The Vcca detector can regulate the voltage level of Vcca through the feedback. The PMOS P3 is a nominal voltage, standard threshold PMOS device. The nwell of the PMOS P3 is tied to Vdd2.

Figure 22:
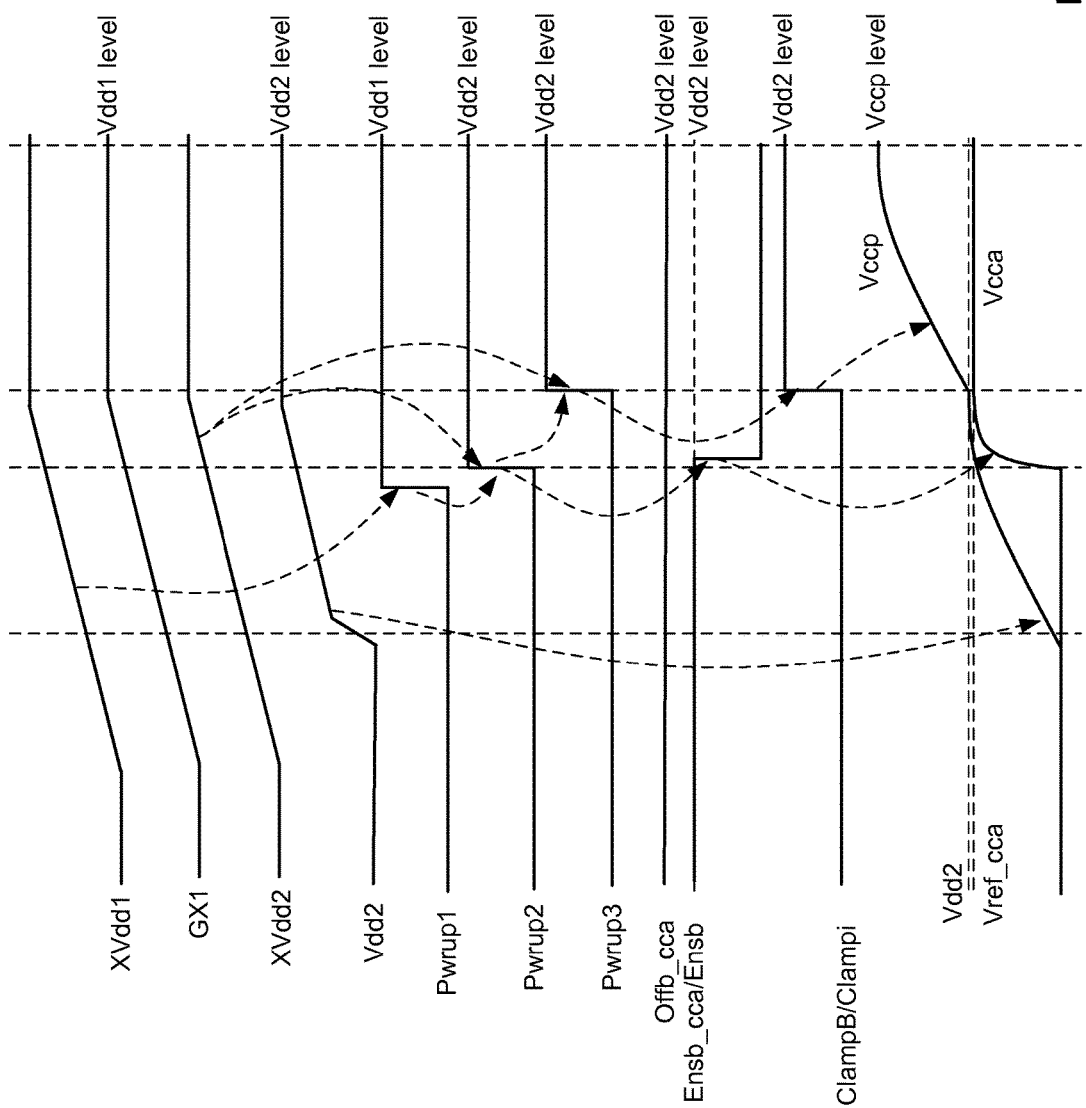
FIG. 22 illustrates another graph of external voltages, internal voltages, and powering up voltages of a memory device of the present disclosure.

FIG. 22 illustrates another graph of external voltages, internal voltages, and powering up voltages of a memory device of the present disclosure. The voltages Vccp and Vcca for the memory device are generated as a function of the external voltages XVdd1 and XVdd2, the internal voltages Vdd1 and Vdd2, and other intermediary voltage signals that are generated during power up of the memory device.

During power up and even after, the Vccp signal is greater than Vcca at all times. When Vdd2 reaches a threshold value, then the Vccp signal follows the curve of the Vdd1. The voltage value of Vccp is clamped to Vdd2 until a charge pump takes over to pump the Vccp signal to a value greater than Vdd2. The Vcca voltage follows after the Vccp voltage increases, and then maintains at a steady level below the Vdd2 voltage. In this manner, the Vccp voltage is never lower than the Vcca voltage.

Thus, at power up, both XVdd1 and XVdd2 are ramped up which generates Pwrup1, Pwrup2, and Pwrup3 signals as previously mentioned. The Vccp and Vcca signals are initially set low to a Vss level. The deep power down signal stays low during power up. The Offb_cca signal stays high during power up, and is set low during a deep power down of the memory device. As XVdd1 ramps up, GX1 follows XVdd1 and enables the NMOS N1 of the Vccp power up driver.

During when the Pwrup2 signal is low, the Vcca signal is held low by the NMOS N4. At the same time, the Ensb_cca signal stays high. Since Offb_cca stays high and Ensb remains high initially, the PMOS P3 of the Vcca power up driver is disabled. Consequently, Vcca is initially not driven by the Vcca power up driver, and remains at a low voltage level.

When the Vdd2 begins to rise and the Pwrup3 signal remains low, ClampB is low initially and remains low until the Pwrup3 signal transitions to a high voltage state. When ClampB is low and as the voltage XVdd2 rises, a Clamp signal from the Vccp power up driver also rises and follows the XVdd2 voltage, which then enables the NMOS N2. Both NMOS N1 and N2 are in an on state, which keeps the signal ClampBi low of the Vccp power up driver. When ClampBi is low and as soon as the Vdd2 voltage rises above a certain threshold voltage, the high voltage low-threshold P2 PMOS device is enabled which drives the voltage Vccp higher earlier and faster than the Vcca signal since the Vcca signal remains low.

When the Pwrup2 signal transitions high, the NMOS N4 is disabled and at the same time, the Vcca detector is enabled which drives the Ensb_cca and Ensb signals low. The low Ensb signal enables the nominal voltage standard threshold PMOS P3 and drives the Vcca signal higher toward the Vcca level. The Vcca signal is fed back to the Vcca detector. Once the Vcca detector is on, it behaves like a comparator or sense amplifier which takes the feedback, i.e., Vcca signal, and compares it against a reference Vref_cca signal. The detector then controls the Ensb signal depending on if the Vcca signal is less than or greater than the Vref_cca signal. If the Vcca signal is less than Vref_cca, then the Ensb signal is enabled and transitions low to drive the Vcca signal. If the Vcca signal is greater than Vref_cca, then the Ensb is disabled and transitions to a high voltage state; in this case, the Vcca signal is not driven.

This process is repeated continuously as long as the Vcca detector is on. The Vcca signal settles at around Vref_cca level and will be maintained at that level by the Vcca detector. Thus, the Vccp signal is precharged to the Vdd2 level prior to when the Pwrup3 signal transitions high. Once Pwrup3 transitions high, which triggers the ClampB signal high, then the Vccp signal is boosted to a higher level by a charge pump. Therefore, the Vccp signal will be higher or equal to the Vcca level at all times, especially during power up of the memory device.

During deep power down, memory devices (e.g., a low power DDR3 DRAM) requires that the respective chip consume less than or equal to 100 uA. To reduce the leakage current from external voltage XVdd1 and XVdd2 during deep power down, the internal supply voltage Vdd1 and Vdd2 are disconnected from XVdd1 and XVdd2 with PMOS devices that are controlled with the DPD signal. These internal supply voltages Vdd1 and Vdd2 along with all the other internal voltages are driven to ground.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A memory device, comprising:
a plurality of memory configuration modes;
an option selection logic for selecting one of the plurality of memory configuration modes to operate the memory device;
test mode registers, wherein the test mode registers provide storage to receive a certain test mode register command; and
bonding pads for selecting a default memory configuration mode,
wherein the bonding pads are connected to inputs of the option selection logic, and
wherein the selected one of the plurality of memory configuration modes is selected as a function of the certain test mode register command and the default memory configuration mode.

2. The memory device of claim 1 wherein the bonding pads are configurable, and wherein the selected one of the plurality of memory configuration modes is further selected as a function of the configured bonding pads.

3. The memory device of claim 1 wherein the certain test mode register command is inputted to the option selection logic, and wherein the default memory configuration mode is overwritten by another one of the plurality of memory configuration modes based on the certain test mode register command.

4. The memory device of claim 1 wherein the plurality of memory configuration modes comprises low power double data rate 2 ("LPDDR2"), low power double data rate 3 ("LPDDR3"), and low power double data rate 4 ("LPDDR4"), wherein the plurality of memory configuration modes have a R+ mode, and wherein the plurality of memory configuration modes have a 32 bit input/output mode and a 16 bit input/output mode.

5. The memory device of claim 1 further comprising mode registers and test mode registers, wherein mode register commands are stored in the mode registers, wherein a certain one of the mode register commands allows for a secondary set of commands, and wherein the secondary set of commands are stored in the test mode registers.

6. The memory device of claim 5 further comprising anti-fuses, wherein the secondary set of commands is used to program the anti-fuses.

7. The memory device of claim 6 further comprising an anti-fuse testing circuit, wherein programming of the anti-fuses is confirmed by the anti-fuse testing circuit.

8. The memory device of claim 7 wherein the anti-fuse testing circuit comprises, a current sense amplifier, a current reference, and a voltage amplifier.

9. The memory device of claim 8 wherein the current sense amplifier senses a current through an anti-fuse under test, wherein a current reference generates a reference current, and wherein the voltage amplifier outputs a digital output based on a determination of whether the sensed current is greater than the current reference.

10. The memory device of claim 1 wherein the bonding pads receive a first bonding pad signal, a second bonding pad signal, and a third bonding pad signal, wherein a first option signal, a second option signal, and a third option signal are generated, and wherein the option selection logic selects the selected one of the plurality of memory configuration modes as a function the first bonding pad signal, the second bonding pad signal, the third bonding pad signal, the first option signal, the second option signal and the third option signal.

11. The memory device of claim 10 wherein the option selection logic further comprises a plurality of latches of generating the first, second, and third option signals, wherein the each of the latches comprises a first inverter, a second inverter, a first NAND gate, a second NAND gate, a third NAND gate, and a fourth NAND gate, and wherein the respective second NAND gates of the latches generate one of the first option signal, second option signal, and third option signal.

12. The memory device of claim 11 wherein for each of the latches,
the output of the first inverter is inputted to the second NAND gate and the third NAND gate,
the output of the second inverter is inputted to the first NAND gate and the fourth NAND gate,
an operational code from a test mode register ("TMR") command is inputted to the first NAND gate,
the TMR command is inputted to the first NAND gate and the third NAND gate,
a command reset signal is inputted to the second inverter,
the output of the first NAND gate is inputted to the second NAND gate and the third NAND gate,
the output of the third NAND gate is inputted to the fourth NAND gate, wherein the output of the second NAND gate is inputted to the fourth NAND gate, and
the output of the fourth NAND gate is inputted to the second NAND gate.

13. The memory device of claim 11 wherein the option selection logic further comprises a first NOR gate, a second NOR gate, a first inverter, a second inverter, a third NOR gate, a fourth NOR gate, a third inverter, a fourth inverter, a fifth NOR gate, a fifth inverter, a sixth inverter, and a seventh inverter, wherein the first NOR gate, the second NOR gate, the first inverter, the second inverter are serially connected, wherein the third NOR gate, the fourth NOR gate, the third inverter, the fourth inverter are serially connected, wherein the fifth NOR gate, the fifth inverter, the sixth inverter, and the seventh inverter are serially connected, wherein the first option signal is inputted to the first NOR gate and the fourth NOR gate, wherein the first bonding pad signal is inputted to the first NOR gate, wherein the second option signal is inputted to the third NOR gate and the second NOR gate, wherein the second bonding pad signal is inputted to the third NOR gate, wherein the third option signal is inputted to the fifth NOR gate, wherein the third bonding pad signal is inputted to the fifth NOR gate, wherein the second inverter outputs an indicator of whether a low power double date rate 2 ("LPDDR2") mode is activated, wherein the fourth inverter outputs an indicator of whether an R+ mode is activated, and wherein the seventh inverter outputs an indicator of whether a 16-bit input/output mode is activated.

14. The memory device of claim 1 wherein the bonding pads receive a first bonding pad signal, a second bonding pad signal, a third bonding pad signal, and a fourth bonding pad signal, wherein a first option signal, a second option signal, a third option signal, and a fourth option signal are received by the option selection logic, and wherein the option selection logic selects the selected one of the plurality of memory configuration modes as a function the first bonding pad signal, the second bonding pad signal, the third bonding pad signal, the fourth bonding pad signal, the first option signal, the second option signal, the third option signal, and the fourth option signal.

15. The memory device of claim 14 wherein the option selection logic comprises an XNOR gate, a first inverter, a second inverter, a first multiplexer, a second multiplexer, a third multiplexer, a fourth multiplexer, a first NAND gate, a second NAND gate, a third NAND gate, a fourth NAND gate, a third inverter, a fourth inverter, a first NOR gate, a fifth inverter, a second NOR gate, and a sixth inverter.

16. The memory device of claim 15 wherein the first option signal and the second option signal are inputted to the XNOR gate, wherein the XNOR gate, the first inverter, and the second inverter are serially connected, wherein the second inverter, the first multiplexer, the second multiplexer, the third multiplexer, the fourth multiplexer are connected in parallel, wherein the output of the first NAND gate is inputted to the third NAND gate and the fourth NAND gate, wherein the output of the second NAND gate is inputted to the third NAND gate and the fourth NAND gate, wherein the outputs of the first multiplexer and the second multiplexer are connected and inputted to the third NAND gate, wherein the outputs of the third multiplexer and the fourth multiplexer are connected and inputted to the fourth NAND gate, wherein the output of the third NAND gate is inputted to the third inverter, wherein the third inverter outputs an indicator of whether a low power double data rate 2 ("LPDDR2") memory configuration is selected, wherein the output of the fourth NAND gate is inputted to the fourth inverter, wherein the fourth inverter outputs an indicator of whether a low power double data rate 3 ("LPDDR3") memory configuration is selected, wherein the first NOR gate and the fifth inverter are serially connected, wherein the fifth inverter outputs an indicator of whether an R+ mode is selected, wherein the second NOR gate and the sixth inverter are serially connected, wherein the sixth inverter outputs an indicator of whether a 16 bit input/output mode is selected, wherein a first bonding pad signal is inputted to the first NOR gate, wherein the second bonding pad signal is inputted to the first multiplexer and the second NAND gate, wherein the third bonding pad signal is inputted to the second NAND gate and the third multiplexer, wherein the fourth bonding pad signal is inputted to the second NOR gate, wherein the first option signal is inputted to the first NOR gate, wherein the second option signal is inputted to the XNOR gate, the first NAND gate, and the fourth multiplexer, wherein the third option signal is inputted to the XNOR gate, the second multiplexer, and the first NAND gate, and wherein the fourth option signal is inputted to the second NOR gate.

17. The memory device of claim 16 wherein the first multiplexer, the second multiplexer, the third multiplexer, and the fourth multiplexer each comprise, a PMOS transistor and an NMOS transistor that are connected in parallel, wherein the PMOS gate of the first multiplexer, the NMOS gate of the second multiplexer, the PMOS gate of the third multiplexer, and the NMOS gate of the fourth multiplexer are connected together, and wherein the NMOS gate of the first multiplexer, the PMOS gate of the second multiplexer, the NMOS gate of the third multiplexer, and the PMOS gate of the fourth multiplexer are connected together.

18. A memory device, comprising:
a plurality of memory configuration modes;
an option selection logic for selecting one of the plurality of memory configuration modes to operate the memory device;
mode registers;
test mode registers;
anti-fuses;
anti-fuse testing circuit; and
bonding pads,
wherein the bonding pads are configurable,
wherein the bonding pads are connected to inputs of the option selection logic,
wherein the test mode registers receive a certain test mode register command,
wherein the selected one of the plurality of memory configuration modes is selected as a function of the configured bonding pads and the certain test mode register command,
wherein the plurality of memory configuration modes comprises low power double data rate 2 ("LPDDR2") and low power double data rate 3 ("LPDDR3"),
wherein the plurality of memory configuration modes has a R+ mode,
wherein the plurality of memory configuration modes have a 32 bit input/output mode and a 16 bit input/output mode,
wherein mode register commands are stored in the mode registers,
wherein one of the mode register commands allows for a secondary set of commands,
wherein the secondary set of commands are stored in the test mode registers,
wherein the secondary set of commands is used to program the anti-fuses,
wherein programming of the anti-fuses is confirmed by the anti-fuse testing circuit,
wherein the anti-fuse testing circuit comprises, a current sense amplifier, a current reference, and a voltage amplifier,
wherein the current sense amplifier senses a current through an anti-fuse under test,
wherein a current reference generates a reference current,
wherein the voltage amplifier outputs a digital output based on a determination of whether the sensed current is greater than the current reference,
wherein the bonding pads receive a first bonding pad signal, a second bonding pad signal, and a third bonding pad signal,
wherein a first option signal, a second option signal, and a third option signal are generated,
wherein the option selection logic selects the selected one of the plurality of memory configuration modes as a function the first bonding pad signal, the second bonding pad signal, the third bonding pad signal, the first option signal, the second option signal and the third option signal,
wherein the option selection logic comprises a plurality of latches of generating the first, second, and third option signals, a first NOR gate, a second NOR gate, a first inverter, a second inverter, a third NOR gate, a fourth NOR gate, a third inverter, a fourth inverter, a fifth NOR gate, a fifth inverter, a sixth inverter, and a seventh inverter, wherein the first NOR gate, the second NOR gate, the first inverter, the second inverter are serially connected, wherein the third NOR gate, the fourth NOR gate, the third inverter, the fourth inverter are serially connected, wherein the fifth NOR gate, the fifth inverter, the sixth inverter, and the seventh inverter are serially connected, wherein the first option signal is inputted to the first NOR gate and the fourth NOR gate, wherein the first bonding pad signal is inputted to the first NOR gate, wherein the second option signal is inputted to the third NOR gate and the second NOR gate, wherein the second bonding pad signal is inputted to the third NOR gate, wherein the third option signal is inputted to the fifth NOR gate, wherein the third bonding pad signal is inputted to the fifth NOR gate, wherein the second inverter outputs an indicator of whether a LPDDR2 mode is activated, wherein the fourth inverter outputs an indicator of whether an R+ mode is activated, and wherein the seventh inverter outputs an indicator of whether a 16-bit input/output mode is activated.

19. A memory device, comprising:
a plurality of memory configuration modes;
an option selection logic for selecting one of the plurality of memory configuration modes to operate the memory device;
mode registers;
test mode registers;
anti-fuses;
anti-fuse testing circuit; and
bonding pads,
wherein the bonding pads are configurable,
wherein the bonding pads are connected to inputs of the option selection logic,
wherein the test mode registers receive a certain test mode register command,
wherein the selected one of the plurality of memory configuration modes is selected as a function of the configured bonding pads and the certain test mode register command,
wherein the plurality of memory configuration modes comprises low power double data rate 2 ("LPDDR2"), low power double data rate 3 ("LPDDR3"), and low power double data rate 4 ("LPDDR4"),
wherein the plurality of memory configuration modes has a R+ mode,
wherein the plurality of memory configuration modes have a 32 bit input/output mode and a 16 bit input/output mode,
wherein mode register commands are stored in the mode registers,
wherein one of the mode register commands allows for a secondary set of commands,
wherein the secondary set of commands are stored in the test mode registers,
wherein the secondary set of commands is used to program the anti-fuses,
wherein programming of the anti-fuses is confirmed by the anti-fuse testing circuit,
wherein the anti-fuse testing circuit comprises, a current sense amplifier, a current reference, and a voltage amplifier,
wherein the current sense amplifier senses a current through an anti-fuse under test,
wherein a current reference generates a reference current,
wherein the voltage amplifier outputs a digital output based on a determination of whether the sensed current is greater than the current reference,
wherein the bonding pads receive a first bonding pad signal, a second bonding pad signal, a third bonding pad signal, and a fourth bonding signal,
wherein a first option signal, a second option signal, a third option signal, and a fourth option signal are generated,
wherein the option selection logic selects the selected one of the plurality of memory configuration modes as a function the first bonding pad signal, the second bonding pad signal, the third bonding pad signal, the fourth bonding pad signal, the first option signal, the second option signal, the third option signal, and the fourth option signal,
wherein the option selection logic comprises an XNOR gate, a first inverter, a second inverter, a first multiplexer, a second multiplexer, a third multiplexer, a fourth multiplexer, a first NAND gate, a second NAND gate, a third NAND gate, a fourth NAND gate, a third inverter, a fourth inverter, a first NOR gate, a fifth inverter, a second NOR gate, and a sixth inverter,
wherein the first option signal and the second option signal are inputted to the XNOR gate,
wherein the XNOR gate, the first inverter, and the second inverter are serially connected,
wherein the second inverter, the first multiplexer, the second multiplexer, the third multiplexer, the fourth multiplexer are connected in parallel,
wherein the output of the first NAND gate is inputted to the third NAND gate and the fourth NAND gate,
wherein the output of the second NAND gate is inputted to the third NAND gate and the fourth NAND gate,
wherein the outputs of the first multiplexer and the second multiplexer are connected and inputted to the third NAND gate,
wherein the outputs of the third multiplexer and the fourth multiplexer are connected and inputted to the fourth NAND gate,
wherein the output of the third NAND gate is inputted to the third inverter,
wherein the third inverter outputs an indicator of whether a LPDDR2 memory configuration mode is selected,
wherein the output of the fourth NAND gate is inputted to the fourth inverter,
wherein the fourth inverter outputs an indicator of whether a LPDDR3 memory configuration mode is selected,
wherein the first NOR gate and the fifth inverter are serially connected,
wherein the fifth inverter outputs an indicator of whether an R+ mode is selected,
wherein the second NOR gate and the sixth inverter are serially connected,
wherein the sixth inverter outputs an indicator of whether a 16 bit input/output mode is selected,
wherein a first bonding pad signal is inputted to the first NOR gate,
wherein the second bonding pad signal is inputted to the first multiplexer and the second NAND gate,
wherein the third bonding pad signal is inputted to the second NAND gate and the third multiplexer,
wherein the fourth bonding pad signal is inputted to the second NOR gate,
wherein the first option signal is inputted to the first NOR gate, wherein the second option signal is inputted to the XNOR gate, the first NAND gate, and the fourth multiplexer, wherein the third option signal is inputted to the XNOR gate, the second multiplexer, and the first NAND gate, wherein the fourth option signal is inputted to the second NOR gate, wherein the first multiplexer, the second multiplexer, the third multiplexer, and the fourth multiplexer each comprise, a PMOS transistor and an NMOS transistor that are connected in parallel, wherein the PMOS gate of the first multiplexer, the NMOS gate of the second multiplexer, the PMOS gate of the third multiplexer, and the NMOS gate of the fourth multiplexer are connected together, and wherein the NMOS gate of the first multiplexer, the PMOS gate of the second multiplexer, the NMOS gate of the third multiplexer, and the PMOS gate of the fourth multiplexer are connected together.

* * * * *